(12) United States Patent
Kim et al.

(10) Patent No.: US 12,501,770 B2
(45) Date of Patent: Dec. 16, 2025

(54) METHOD OF MANUFACTURING DISPLAY APPARATUS

(71) Applicant: Samsung Display Co., Ltd., Yongin-si (KR)

(72) Inventors: Kanguk Kim, Yongin-si (KR); Sanggu Lee, Yongin-si (KR); Juyong Kim, Yongin-si (KR); Sangyeon Hwang, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 727 days.

(21) Appl. No.: 17/861,843

(22) Filed: Jul. 11, 2022

(65) Prior Publication Data

US 2023/0009760 A1 Jan. 12, 2023

(30) Foreign Application Priority Data

Jul. 12, 2021 (KR) .................. 10-2021-0091245

(51) Int. Cl.
| | | |
|---|---|---|
| *H01L 27/32* | (2006.01) | |
| *H10K 59/12* | (2023.01) | |
| *H10K 59/38* | (2023.01) | |
| *H10K 59/80* | (2023.01) | |
| *H10K 102/00* | (2023.01) | |

(52) U.S. Cl.
CPC ......... *H10K 59/1201* (2023.02); *H10K 59/38* (2023.02); *H10K 59/8731* (2023.02); *H10K 2102/00* (2023.02)

(58) Field of Classification Search
CPC ..... H10K 59/1201; H10K 50/84; H10K 71/00
See application file for complete search history.

(56) References Cited

U.S. PATENT DOCUMENTS

2011/0206832 A1* 8/2011 Obata ...................... B41J 3/407
118/705
2018/0164640 A1* 6/2018 Kim .................. G02F 1/133606

FOREIGN PATENT DOCUMENTS

| JP | 2008-264673 | 11/2008 |
|---|---|---|
| JP | 4894842 | 3/2012 |
| JP | 4985254 | 7/2012 |
| JP | 5111615 | 1/2013 |
| KR | 10-2014-0097379 | 8/2014 |

* cited by examiner

*Primary Examiner* — Nathan T Leong
(74) *Attorney, Agent, or Firm* — Harness, Dickey & Pierce, P.L.C.

(57) ABSTRACT

A method of manufacturing a display apparatus includes discharging liquid droplets in a first area of a substrate, moving a discharge part by a first distance along a side of the substrate and discharging the liquid droplets in a second area of the substrate, and moving the discharge part by a second distance along the side of the substrate and discharging the liquid droplets in a third area of the substrate. The first distance is different from the second distance.

20 Claims, 24 Drawing Sheets

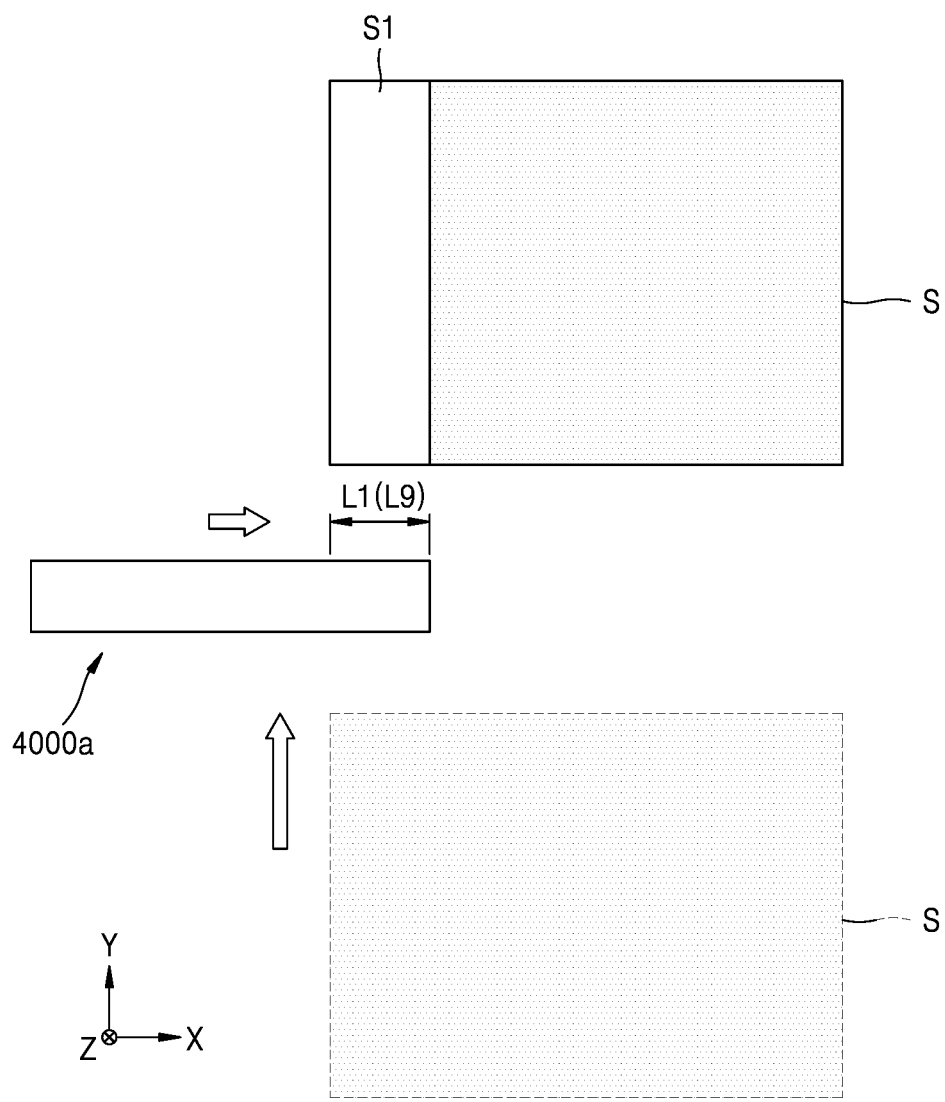

FIG. 11D
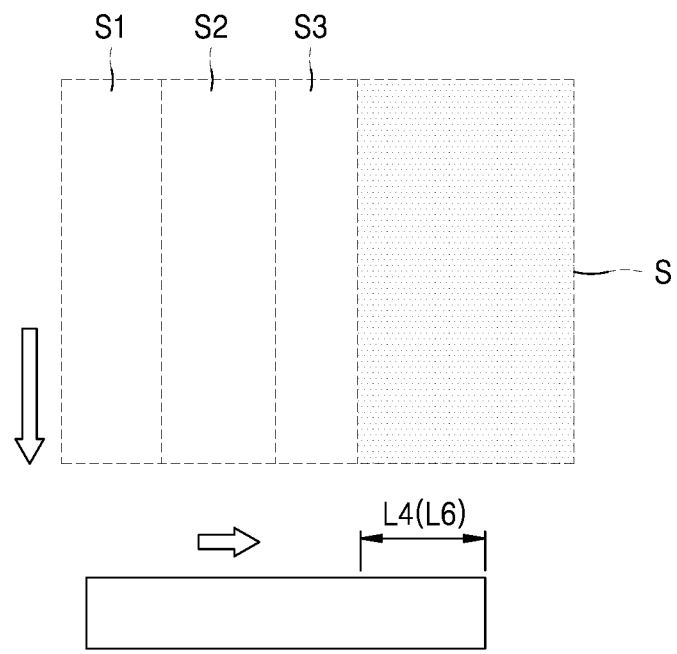
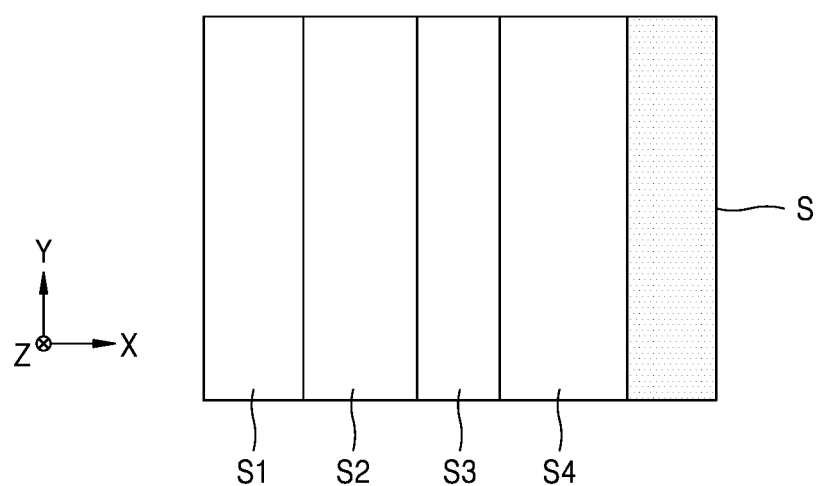

FIG. 11E
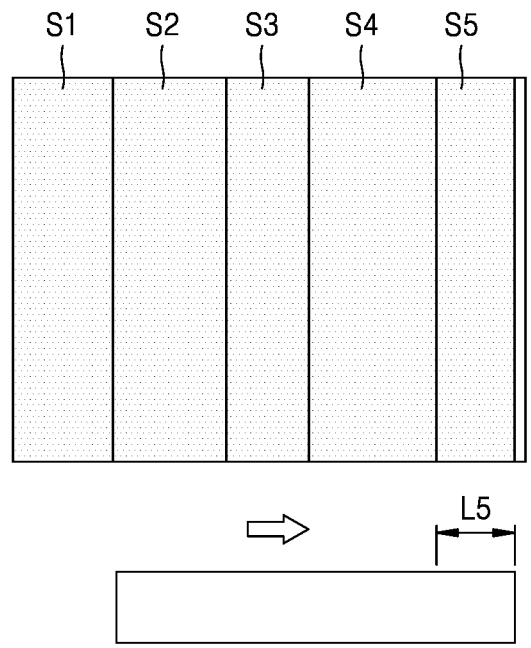
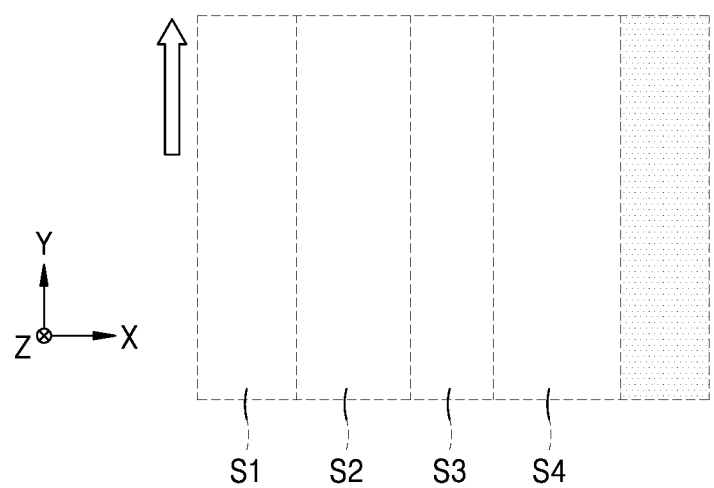

FIG. 13

```
NOZZLE INFORMATION / EMISSION AREA INFORMATION
    / CONCENTRATION OF LIQUID DROPLETS
                    ↓
            GENERATE GENE
                    ↓
          CALCULATE SUITABILITY
                    ↓
         SELECT / CROSSOVER / MUTATE
                    ↓
      MAXIMUM SUITABILITY < SUITABILITY
           NO ↲                    ↓ YES
                                  END
```

METHOD OF MANUFACTURING DISPLAY APPARATUS

CROSS-REFERENCE TO RELATED APPLICATION(S)

This application claims priority to and the benefits of Korean Patent Application No. 10-2021-0091245 under 35 U.S.C. § 119 to, filed on Jul. 12, 2021, in the Korean Intellectual Property Office, the entire contents of which are incorporated herein by reference.

BACKGROUND

1. Technical Field

The embodiments relate to a method of manufacturing a display apparatus.

2. Description of the Related Art

Mobile electronic devices have been widely used. Such mobile electronic devices include not only miniaturized electronic devices such as mobile phones, but also tablet personal computers (PC) which have been widely used recently.

To support various functions, the mobile electronic devices include a display apparatus to provide a user with visual information, such as an image. Recently, because the parts driving a display apparatus have been miniaturized, the importance of the display apparatus in an electronic device has gradually increased. Displays may be bent to form an angle with respect to a flat surface are also under development.

The display apparatus may include an emission layer or a color filter, the emission layer including quantum dots and scatterers, and the color filter including a color-converting layer or scatterers. When the display apparatus does not operate properly due to the concentration of scatterers, a moiré phenomenon may occur.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Liquid droplets including scatterers may be supplied and arranged on a substrate by using a nozzle to form an emission layer or color converting layer. A moiré phenomenon may occur due to the concentration of scatterers and the like included in the liquid droplets. When the nozzle is moved by the same distance, the moiré phenomenon may severe and may be visible to the user. The embodiments provide a method of manufacturing a display apparatus in which the concentration of liquid droplets arranged on the entire surface of a substrate may be uniform.

Aspects of the embodiments will be set forth in the descriptions below. Other aspects will be apparent from the description, or may be learned by practice of the embodiments.

According to an embodiment, a method of manufacturing a display apparatus includes discharging liquid droplets in a first area of a substrate, moving a discharge part by a first distance along a side of the substrate and discharging the liquid droplets in a second area of the substrate, and moving the discharge part by a second distance along the side of the substrate and discharging the liquid droplets in a third area of the substrate. The first distance may be different from the second distance.

The liquid droplets may include quantum dots.

The liquid droplets may include scatterers.

The liquid droplets may include titanium oxide.

The method may further include forming a color filter layer over the substrate.

The first distance and the second distance may each be a multiple of a distance between emission areas emitting light of a same color.

The method may further include arranging nozzles to correspond to different emission areas that emit light of a same color. The nozzles may be different from each other.

The method may further include linearly moving the substrate in a first direction.

The method may further include linearly moving the substrate in a direction opposite to the first direction.

The discharge part may move in a direction different from the first direction.

According to an embodiment, a method of manufacturing a display apparatus includes discharging liquid droplets in a first area of a substrate while linearly moving the substrate in a first direction, moving a discharge part by a first distance along a side of the substrate, discharging the liquid droplets in a second area of the substrate from the discharge part while linearly moving the substrate in a direction opposite to the first direction, moving the discharge part by a second distance along the side of the substrate, and discharging liquid droplets in a third area of the substrate from the discharge part while linearly moving the substrate in the first direction. The first distance is different from the second distance.

The liquid droplets may include quantum dots.

The liquid droplets may include scatterers.

The liquid droplets may include titanium oxide.

The first distance and the second distance may each be a multiple of a distance between emission areas emitting light of a same color.

The method may further include forming a color filter layer over the substrate.

A moving direction of the discharge part may be different from the first direction.

The method may further include forming a thin-film encapsulation layer over the substrate.

The method may further include arranging the substrate on a display panel.

The discharge part may include a plurality of nozzles.

These and/or other aspects will become apparent and more readily appreciated from the following description of the embodiments, the accompanying drawings, and claims.

These aspects may be implemented by using a system, a method, a computer program, or a combination of a system, method, and computer program.

BRIEF DESCRIPTION OF THE DRAWINGS

The above and other aspects and features of the disclosure will become more apparent by describing in detail embodiments thereof with reference to the attached drawings, in which:

FIGS. 11A to 11E are schematic plan views of a portion of a manufacturing apparatus for a display apparatus according to an embodiment;

FIG. 13 is a flowchart showing a method of manufacturing a display apparatus according to an embodiment;

DETAILED DESCRIPTION OF THE EMBODIMENTS

Figure 1:
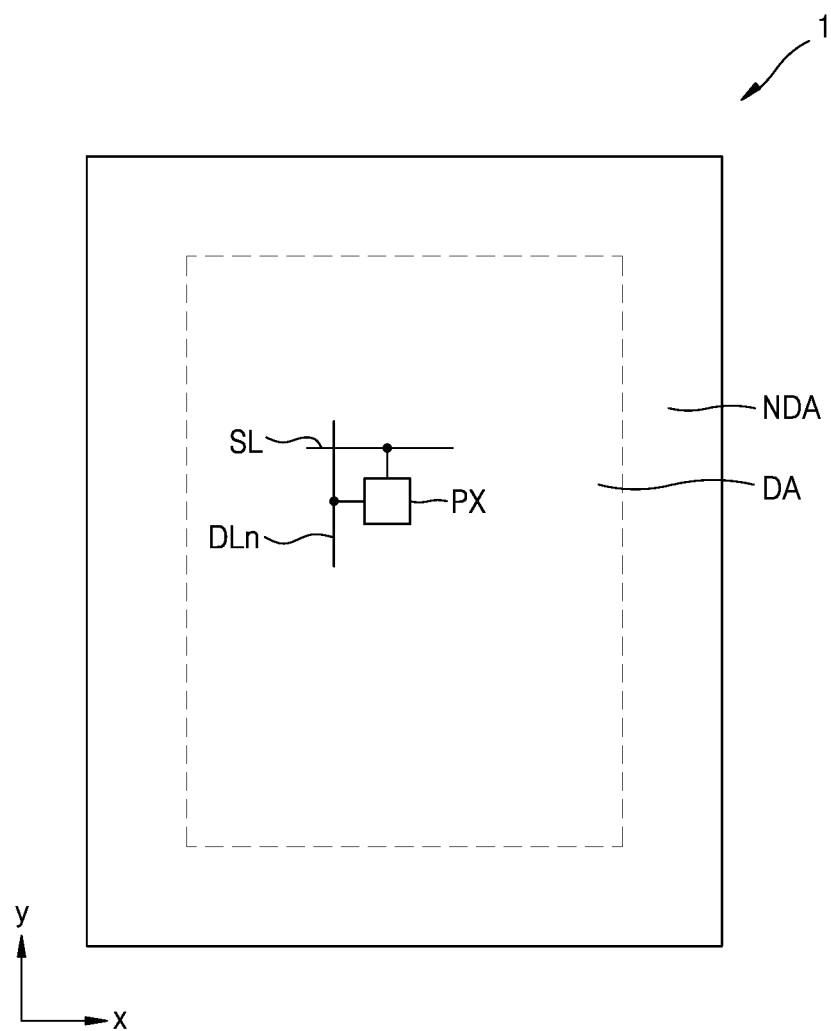
FIG. 1 is a schematic plan view of a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. For example, intervening layers, regions, or components may be present.

Sizes of elements in the drawings may be exaggerated or reduced for convenience of explanation. For example, since sizes and thicknesses of elements in the drawings are arbitrarily illustrated for convenience of explanation, the disclosure is not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When an embodiment may be implemented differently, a certain process order may be performed differently from the described order. For example, two consecutively described processes may be performed substantially at the same time or performed in an order opposite to the described order.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

FIG. 1 is a schematic plan view of a display apparatus 1 according to an embodiment.

Referring to FIG. 1, the display apparatus 1 includes a display area DA and a non-display area NDA, the display area DA displaying images, and the non-display area NDA not displaying images. The display apparatus 1 may display images by using light emitted from pixels PX arranged in the display area DA. Each pixel PX may emit red, green, blue, or white light. Although FIG. 1 shows one pixel PX, the embodiment is not limited thereto and multiple pixels PX may be arranged to be apart from each other in the display area DA. Multiple pixels PX arranged in the display area DA may be provided. The pixels PX may be arranged on the entire display area DA, such that the pixels PX are spaced apart from each other in a first direction and a second direction.

The display apparatus 1 may be an apparatus displaying images and may be included in a portable mobile device such as a game console, a multimedia device, or a ultra-miniature personal computer (PC). The display apparatus 1 described below may include liquid crystal displays, electrophoretic displays, organic light-emitting displays, inorganic light-emitting displays, field emission displays, surface-conduction electron-emitter displays, quantum dot displays, plasma displays, cathode ray displays, and the like. Hereinafter, though an organic light-emitting display apparatus is described as the display apparatus 1 manufactured by the method according to the embodiments, embodiments may also be used in manufacturing other types of display apparatuses described above.

The pixels PX may each be electrically connected to a scan line SL and a data line DLn. The scan line SL may extend in an x-direction, and the data line DLn may extend in a y-direction.

Figure 2:
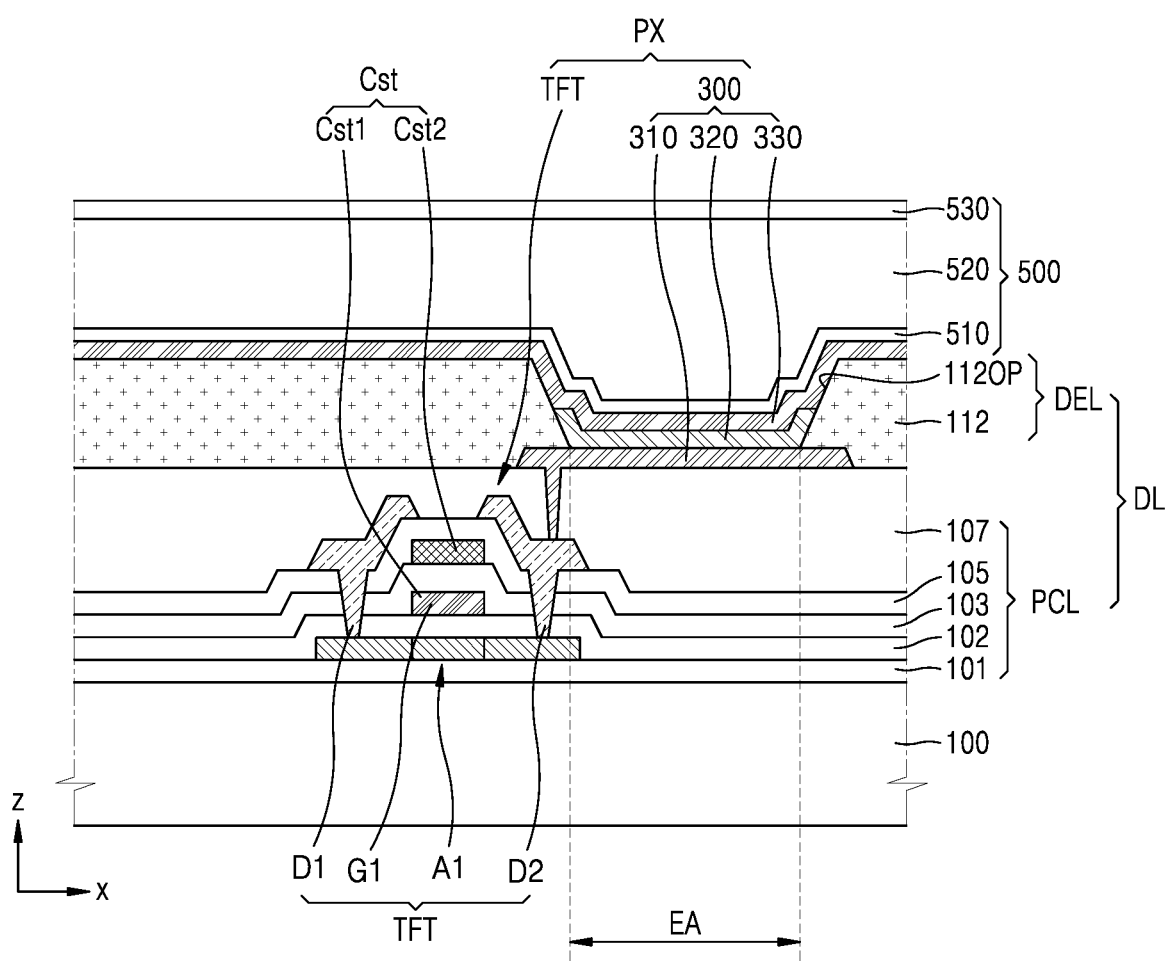
FIG. 2 is a schematic cross-sectional view of a pixel shown in FIG. 1.

FIG. 2 is a schematic cross-sectional view of the pixel shown in FIG. 1.

Referring to FIG. 2, a display layer DL, a thin-film encapsulation layer 500 may be arranged on a substrate 100. The display layer DL may include a pixel circuit layer PCL and a display element layer DEL.

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose tri acetate, and cellulose acetate propionate.

A barrier layer (not shown) may be further arranged between the display layer DL and the substrate 100. The barrier layer prevents the penetration of external foreign materials and may be a single layer or a multi-layer including inorganic materials such as silicon nitride ($SiN_x$, x>0) and silicon oxide ($SiO_x$, x>0).

The pixel-defining layer PCL is arranged on the substrate 100. It is shown in FIG. 2 that the pixel circuit layer PCL includes a thin-film transistor TFT, a buffer layer 101, a first gate insulating layer 102, a second gate insulating layer 103, an interlayer insulating layer 105, and a planarization layer 107 arranged on/under elements of the thin-film transistor TFT.

The buffer layer 101 may include an inorganic insulating layer including silicon nitride, silicon oxynitride, and silicon oxide and include a single layer or a multi-layer including the inorganic insulating material.

The thin-film transistor TFT may include a semiconductor layer A1. The semiconductor layer A1 may include polycrystalline silicon. In other examples, the semiconductor layer A1 may include amorphous silicon, an oxide semiconductor, or an organic semiconductor. The semiconductor layer A1 may include a channel region, a drain region, and a source region, the drain region and the source region being respectively on two opposite sides of the channel region.

A gate electrode G1 may overlap the channel region. The gate electrode G1 may include a low-resistance metal material. The gate electrode G1 may include a conductive material including molybdenum (Mo), aluminum (Al), copper (Cu), and titanium (Ti) and have a single-layered structure or a multi-layered structure including the above materials.

The first gate insulating layer 102 between the semiconductor layer A1 and the gate electrode G1 may include an inorganic insulating material including silicon oxide ($SiO_2$), silicon nitride ($SiN_x$), silicon oxynitride (SiON), aluminum oxide ($A_2O_3$), titanium oxide ($TiO_2$), tantalum oxide ($Ta_2O_5$), hafnium oxide ($HfO_2$), or zinc oxide ($ZnO_2$).

The second gate insulating layer 103 may cover the gate electrode G1. Similar to the first gate insulating layer 102, the second gate insulating layer 103 may include an inorganic insulating material including silicon oxide ($SiO_2$), silicon nitride ($SiN_x$), silicon oxynitride (SiON), aluminum oxide ($A_2O_3$), titanium oxide ($TiO_2$), tantalum oxide ($Ta_2O_5$), hafnium oxide ($HfO_2$), or zinc oxide ($ZnO_x$). Here, zinc oxide ($ZnO_x$) may include zinc oxide (ZnO) and/or zinc peroxide ($ZnO_2$).

An upper electrode Cst2 of a storage capacitor Cst may be arranged on the second gate insulating layer 103. The upper electrode Cst2 may overlap the gate electrode G1 disposed below. The gate electrode G1 and the upper electrode Cst2 which overlapping each other with the second gate insulating layer 103 between them may constitute the storage capacitor Cst. The gate electrode G1 may serve as a lower electrode Cst1 of the storage capacitor Cst.

As described above, the storage capacitor Cst may overlap the thin-film transistor TFT. In an embodiment, the storage capacitor Cst may not overlap the thin-film transistor TFT.

The upper electrode Cst2 may include a single layer or a multi-layer including aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu).

The interlayer insulating layer 105 may cover the upper electrode Cst2. The interlayer insulating layer 105 may include silicon oxide ($SiO_2$), silicon nitride ($SiN_x$), silicon oxynitride (SiON), aluminum oxide ($A_2O_3$), titanium oxide ($TiO_2$), tantalum oxide ($Ta_2O_5$), hafnium oxide ($HfO_2$), or zinc oxide ($ZnO_x$). Here, zinc oxide ($ZnO_x$) may include zinc oxide (ZnO) and/or zinc peroxide ($ZnO_2$). The interlayer insulating layer 105 may include a single layer or a multi-layer including the above inorganic insulating material.

A drain electrode D1 and a source electrode D2 may be arranged on the interlayer insulating layer 105. The drain electrode D1 and the source electrode D2 may each include a conductive material. The drain electrode D1 and the source electrode D2 may each include a conductive material including molybdenum (Mo), aluminum (Al), copper (Cu), and titanium (Ti) and have a single-layered structure or a multi-layered structure including the above materials. In an embodiment, the drain electrode D1 and the source electrode D2 may have a multi-layered structure of Ti/Al/Ti.

The planarization layer 107 may include an organic insulating layer. The planarization layer 107 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The display element layer DEL may be arranged on the pixel circuit layer PCL having the above structure. The display element layer DEL may include an organic light-emitting element 300. A pixel electrode 310 of the organic light-emitting diode 300 may be electrically connected to the thin-film transistor TFT through a contact hole of the planarization layer 107.

The pixel PX may include the organic light-emitting element 300 and the thin-film transistor TFT. Each pixel PX may emit, for example, red, green, or blue light, or red, green, blue, or white light from the organic light-emitting element 300.

The pixel electrode 310 may include a conductive oxide such as indium tin oxide (ITO), indium zinc oxide (IZO), zinc oxide (ZnO), indium oxide (In$_2$O$_3$), indium gallium oxide (IGO), or aluminum zinc oxide (AZO). In other embodiments, the pixel electrode 310 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. The pixel electrode 310 may further include a layer on/under the reflective layer, the layer including ITO, IZO, ZnO, or In$_2$O$_3$.

A pixel-defining layer 112 is arranged on the pixel electrode 310, the pixel-defining layer 112 including an opening 112OP that exposes the central portion of the pixel electrode 310. The pixel-defining layer 112 may include an organic insulating material and/or an inorganic insulating material. The opening 112OP may define an emission area of light (referred to as an emission area EA, hereinafter) emitted from the organic light-emitting element 300. As an example, the width of the opening 112OP may correspond to the width of the emission area EA.

An intermediate layer 320 may be arranged in the opening 112OP of the pixel-defining layer 112, the intermediate layer 320 including an organic emission layer or a quantum-dot emission layer. The intermediate layer 320 may include a polymer organic material or a low-molecular weight organic material emitting light of a preset color. The intermediate layer 320 may be formed by discharging liquid droplets using a manufacturing apparatus for a display apparatus according to an embodiment.

Though not shown, a first functional layer and a second functional layer may be respectively arranged under and on the organic emission layer of the intermediate layer 320. The first functional layer may include, for example, a hole transport layer (HTL) or include an HTL and a hole injection layer (HIL). The second functional layer is arranged on the intermediate layer 320 and may be provided optionally. The second functional layer may include an electron transport layer (ETL) and/or an electron injection layer (EIL). Like a common electrode 330 described below, the first functional layer and/or the second functional layer may be common layers covering the substrate 100 entirely.

In case that the intermediate layer 320 includes a quantum-dot emission layer, the quantum-dot emission layer may include quantum dots each having a core-shell structure. The core of the quantum dot may include a Group II-VI compound, a Group III-V compound, a Group IV-VI compound, a Group IV element, a Group IV compound, and combinations thereof.

A Group II-VI compound may include a two-element compound including CdSe, CdTe, ZnS, ZnSe, ZnTe, ZnO, HgS, HgSe, HgTe, MgSe, MgS, and a mixture thereof; a three-element compound including AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound including HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

A Group III-V compound may include a two-element compound including GaN, GaP, GaAs, GaSb, AlN, AlP, AlAs, AlSb, InN, InP, InAs, InSb, and a mixture thereof; a three-element compound including GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a four-element compound including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

A Group IV-VI compound may include a two-element compound including SnS, SnSe, SnTe, PbS, PbSe, PbTe, and a mixture thereof; a three-element compound including SnSeS, SnSeTe, SnSTe, PbSeS, PbSeTe, PbSTe, SnPbS, SnPbSe, SnPbTe, and a mixture thereof; and a four-element compound including SnPbSSe, SnPbSeTe, SnPbSTe, and a mixture thereof. A Group IV element may include one of Si, Ge, and a mixture thereof. A Group IV compound may include a two-element compound including one of SiC, SiGe, and a mixture thereof.

The two-element compound, the three-element compound, or the four-element compound may be present inside a particle at a uniform concentration, or may be divided into areas with partially different concentration distributions within in the same particle. A core-shell structure in which one quantum dot surrounds another quantum dot may also be provided. An interface between the core and the shell may have a concentration gradient in which the concentration of an element existing in the shell decreases toward the center.

In an embodiment, a quantum dot may have a core-shell structure including a core and a shell, the core including a nano crystal, and the shell surrounding the core. The shell of a quantum dot may serve as a protective layer that prevents a chemical change of the core to maintain a semiconductor characteristic and/or serve as a charging layer for giving an electrophoretic characteristic to the quantum dot. The shell may include a single layer or a multi-layer. An interface between the core and the shell may have a concentration gradient in which the concentration of an element in the shell decreases toward the center. Examples of the shell of the quantum dot include oxide of metal or non-metal, a semiconductor compound, or a combination thereof.

As an example, the oxide of metal or non-metal may include a two-element compounding including SiO$_2$, Al$_2$O$_3$, TiO$_2$, ZnO, MnO, Mn$_2$O$_3$, Mn$_3$O$_4$, CuO, FeO, Fe$_2$O$_3$, Fe$_3$O$_4$, CoO, Co$_3$O$_4$, NiO, or a three-element compound including MgAl$_2$O$_4$, CoFe$_2$O$_4$, NiFe$_2$O$_4$, and CoMn$_2$O$_4$, but the embodiment is not limited thereto.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, but the embodiment is not limited thereto.

A quantum dot may have a full width of half maximum (FWHM) of a light emission wavelength spectrum of about 45 nm or less, for example, about 40 nm or less, and about 30 nm or less. Within this range, color purity or color reproduction may be improved. Because light emitted from the quantum dot is emitted in all directions, a viewing angle of light may be improved.

Though the shape of the quantum dot is not particularly limited, the shape of the quantum dot may include a spherical shape, a pyramid shape, a multi-arm shape, or a cubic nano particle, a nano tube, a nano wire, a nano fiber, and a nano plate particle in an embodiment.

The color of light emitted may be adjusted depending on a particle size of a quantum dot. Accordingly, a quantum dot may have various light-emitting colors such as blue, red, green, and the like.

Though not shown in the drawing, a hole layer may be arranged on the upper surface of the quantum-dot emission layer. The hole layer may include a hole transport layer and/or a hole injection layer. The hole layer may include an organic material or an inorganic material. In an embodiment, the hole layer may include one of CBP, α-NPD, TCTA, and DNTPD. In other examples, the hole layer may include NiO or $MoO_3$.

An inorganic electron layer may be arranged between the upper surface of the quantum-dot emission layer and the pixel electrode 310. The inorganic electron layer may include metal oxide. The metal may include alkaline earth metals, transition metals, Group 13 metals, and/or Group 14 metals. As an example, metal in the metal oxide may include Zn, Ti, Zr, Sn, W, Ta, Ni, Mo, Cu, Mg, Co, Mn, Y, Al, or a combination thereof.

The quantum-dot emission layer may include particles. As an example, particles may include scatterers. The scatterers may include $TiO_2$.

The common electrode 330 may include a conductive material having a small work function. As an example, the common electrode 330 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. In other examples, the common electrode 330 may further include a layer on the (semi) transparent layer, the layer including ITO, IZO, ZnO, or $In_2O_3$.

In an embodiment, the thin-film encapsulation layer 500 may include at least one inorganic encapsulation layer and at least one organic encapsulation layer. In an embodiment, it is shown in FIG. 2 that the thin-film encapsulation layer 500 includes a first inorganic encapsulation layer 510, an organic encapsulation layer 520, and a second inorganic encapsulation layer 530 that are sequentially stacked.

The first inorganic encapsulation layer 510 and the second inorganic encapsulation layer 530 may include an inorganic material from among aluminum oxide, titanium oxide, tantalum oxide, hafnium oxide, zinc oxide, silicon oxide, silicon nitride, and silicon oxynitride. The organic encapsulation layer 520 may include a polymer-based material. The polymer-based material may include an acryl-based resin, an epoxy-based resin, polyimide, and polyethylene. In an embodiment, the organic encapsulation layer 520 may include acrylate.

In other examples, the encapsulation layer 500 may have a structure in which the substrate 100 is attached to an upper substrate, which is a transparent member, by using a sealing member, and thus, an inner space between the substrate 100 and the upper substrate is sealed. A moisture absorber or a filling material may be disposed in the inner space. The sealing member may include sealant. In an embodiment, the sealing member may include a material hardened by a laser. As an example, the sealing member may include frit. The sealing member may include a urethane-based resin, an epoxy-based resin, an acryl-based resin, which are organic sealants, or silicon, which is an inorganic sealant. For a urethane-based resin, urethane acrylate and the like may be used as an example. For an acryl-based resin, butylacrylate, ethylhexyl acrylate and the like may be used as an example. The sealing member may include a material hardened by heat.

A touch electrode layer (not shown) including touch electrodes may be arranged on the thin-film encapsulation layer 500. An optical functional layer (not shown) may be arranged on the touch electrode layer. The touch electrode layer may obtain coordinate information corresponding to an external input, for example, a touch event. The optical functional layer may reduce the reflectivity of light (external light) incident toward the display apparatus 1 from the outside and/or improve color purity of light emitted from the display apparatus 1. In an embodiment, the optical functional layer may include a retarder and a polarizer. The retarder may include a film-type retarder or a liquid crystal-type retarder. The retarder may include a λ/2 retarder and/or a λ/4 retarder. The polarizer may include a film-type polarizer or a liquid crystal-type polarizer. The film-type polarizer may include a stretchable synthetic resin film, and the liquid crystal-type polarizer may include liquid crystals arranged in a selected arrangement. Each of the retarder and the polarizer may further include a protective film.

In an embodiment, the optical functional layer may include a black matrix and color filters. The color filters may be arranged by the colors of light emitted respectively from the pixels of the display apparatus 1. The color filters may each include red, green, or blue pigment or dye. in other examples, the color filters may each further include quantum dots in addition to the pigment or dye. Some of the color filters may not include the pigment or dye and may include particles (e.g., scatterers) including titanium oxide. The color filters may be formed by discharging liquid droplets using a manufacturing apparatus for a display apparatus according to an embodiment.

In an embodiment, the optical functional layer may include a destructive interference structure. The destructive interference structure may include a first reflection layer and a second reflection layer respectively arranged on different layers. First-reflected light and second-reflected light respectively reflected by the first reflection layer and the second reflection layer may destructively interfere and thus the reflectivity of external light may be reduced.

An adhesive member may be arranged between the touch electrode layer and the optical functional layer. For the adhesive member, a general adhesive may be employed without limitation. The adhesive member may be a pressure sensitive adhesive (PSA).

The quantum-dot emission layer may be formed by the manufacturing apparatus (for example, refer to display apparatus 1000 in FIG. 5) described below. As an example, the intermediate layer 320 may be formed by supplying liquid droplets from discharge parts described below (refer to discharge parts 4000 in FIG. 5). The liquid droplets may further include particles (e.g., scatterers). An apparatus 1000 (refer to FIG. 5) for manufacturing a display apparatus may discharge the organic emission layer in the opening 112OP, the organic emission layer including particles (e.g., scatterers). Hereinafter, the apparatus 1000 (refer to FIG. 5) for manufacturing a display apparatus is described as being configured to arrange the quantum-dot emission layer (including quantum dot particles) in the opening 112OP.

The discharge parts (refer to discharge parts 4000 in FIG. 5) may supply liquid droplets including quantum-dot emission layers emitting light of different colors. As an example, one of the discharge parts may supply liquid droplets including a red quantum-dot emission layer. Another discharge part may supply liquid droplets including a green quantum-dot emission layer. Another discharge part may supply liquid droplets including a blue quantum-dot emission layer.

The discharge parts (refer to discharge parts 4000 in FIG. 5) may be used to form intermediate layers 320 that emits light of the same color (for example, the intermediate layers 320 of neighboring pixels PX). Hereinafter, the example where a nozzle (not shown) of one of the discharge parts (refer to discharge parts 4000 in FIG. 5) may be used to form the intermediate layers 320 that emits light of the same color is described in detail.

Figure 5:
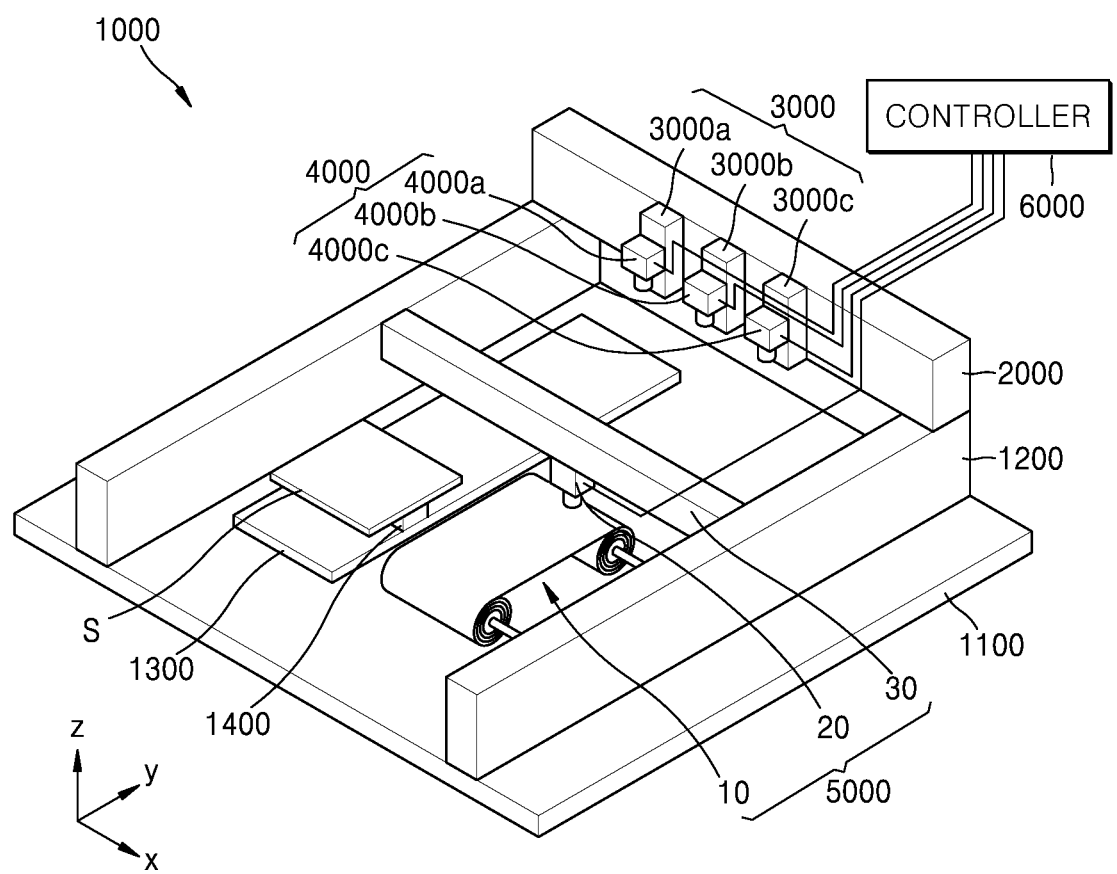
FIG. 5 is a schematic perspective view of a manufacturing apparatus for a display apparatus according to an embodiment.

The nozzle of one of the discharge parts (refer to discharge parts 4000 in FIG. 5) may supply liquid droplets to a display substrate S (refer to FIG. 5). The liquid droplets may be inserted into the opening 112OP of the pixel-defining layer 112. The display substrate S in FIG. 5 may substantially correspond to the layers from the substrate 100 up to the pixel-defining layer 112 in FIG. 2.

The moving distance of the first discharge part may be controlled such that not only the concentration of particles included in the intermediate layer 320 is substantially the same or similar to a set concentration, but also the concentration of particles included in the intermediate layer 320 of each pixel that emits light of the same color in the display substrate S (refer to FIG. 5) is uniform. A method of controlling the moving distance of the discharge part is described below in detail.

After the intermediate layer 320 is formed, an intermediate layer 320 of another color arranged on the display substrate S (refer to FIG. 5) may be formed. The intermediate layers 320 implementing different colors may be formed from different nozzles or different discharge parts.

The manufacturing of the display apparatus may be completed by sequentially forming the common electrode 330, the first inorganic encapsulation layer 510, the organic encapsulation layer 520, and the second inorganic encapsulation layer 530 on the display substrate S (refer to FIG. 5).

Figure 3:
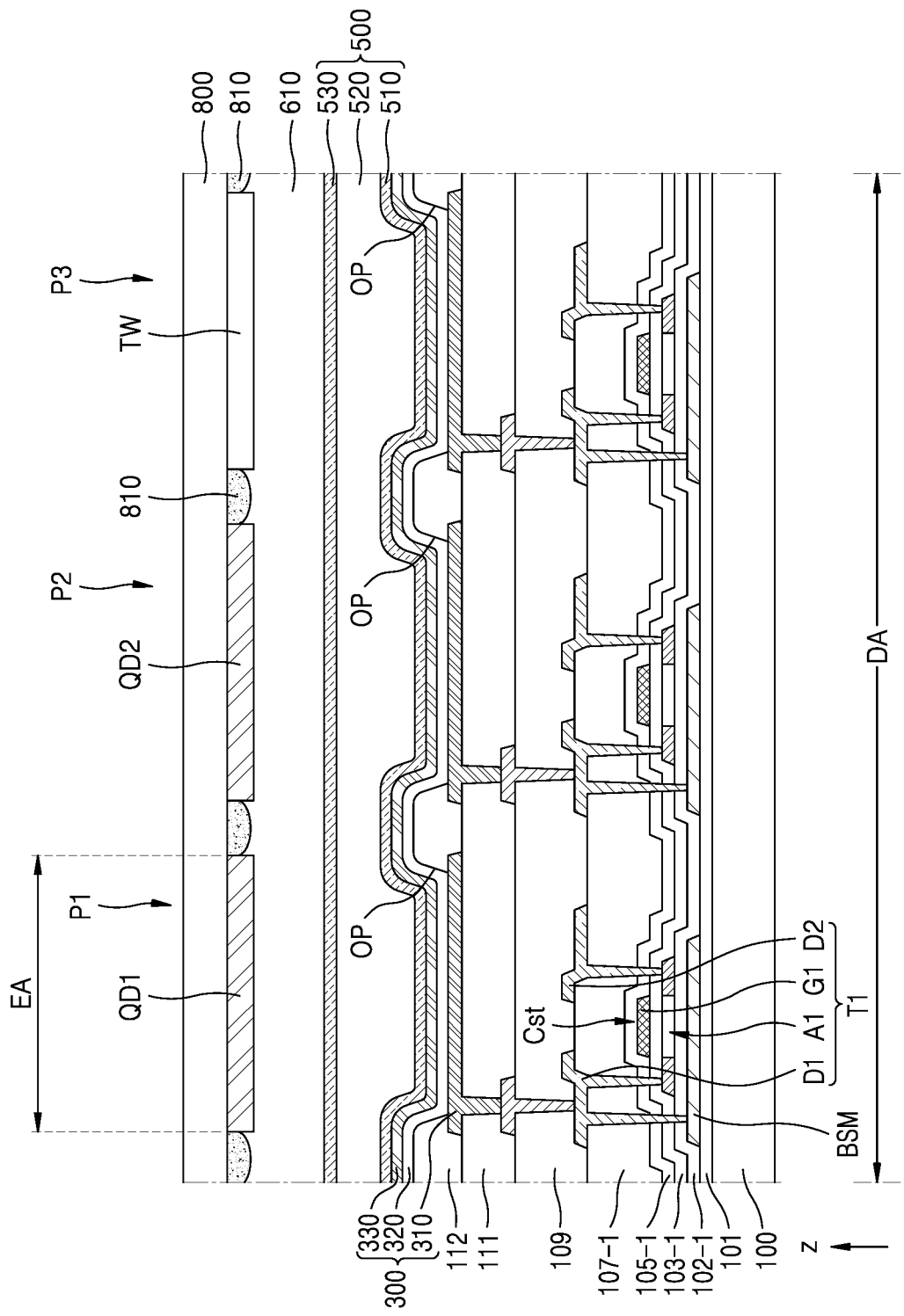
FIG. 3 is a schematic cross-sectional view of a portion of a display apparatus according to an embodiment.

FIG. 3 is a schematic cross-sectional view of a portion of a display apparatus according to an embodiment.

Referring to FIG. 3, the display apparatus (not shown) may include a display area DA and a non-display area (not shown). The non-display area is substantially the same as or similar to that shown in FIG. 1, and only the different portions of the display area DA are described in detail.

The display apparatus may include a buffer layer 101 and an additional buffer layer 102. The buffer layer 101 and the additional buffer layer 102 may include silicon oxide ($SiO_2$), silicon nitride ($SiN_x$), silicon oxynitride (SiON), aluminum oxide ($A_2O_3$), titanium oxide ($TiO_2$), tantalum oxide ($Ta_2O_5$), hafnium oxide ($HfO_2$), or zinc oxide ($ZnO_x$). Zinc oxide ($ZnO_x$) may include zinc oxide (ZnO) and/or zinc peroxide ($ZnO_2$).

A bias electrode BSM may be arranged between the buffer layer 101 and the additional buffer layer 102 to correspond to a thin-film transistor T1. The bias electrode BSM may overlap the semiconductor layer A1 of the thin-film transistor T1. A voltage may be applied to the bias electrode BSM. The bias electrode BSM may prevent external light from reaching the semiconductor layer A1. Accordingly, the characteristics of the thin-film transistor T1 may be stabilized. The bias electrode BSM may be omitted.

The thin-film transistor T1 includes the semiconductor layer A1, the gate electrode G1, a source electrode S1, and a drain electrode D1. The semiconductor layer A1 may include amorphous silicon or polycrystalline silicon. In an embodiment, the semiconductor layer A1 may include an oxide of at least one of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In an embodiment, the semiconductor layer A1 may include a Zn-oxide-based material and include Zn-oxide, In—Zn oxide, Ga—In—Zn oxide, and the like. In an embodiment, the semiconductor layer A1 may include In—Ga—Zn—O (IGZO), In—Sn—Zn—O (ITZO), or In—Ga—Sn—Zn—O (IGTZO) semiconductor-containing metal such as indium (In), gallium (Ga), and tin (Sn) in ZnO. The semiconductor layer A1 may include a first channel region, a source region, and a drain region, the source region and the drain region being respectively on two opposite sides of the channel region. The semiconductor layer A1 may include a single layer or a multi-layer.

A first gate insulating layer 103, the gate electrode G1, a second gate insulating layer 105, an interlayer insulating layer 107, and a first planarization layer 109, and a second planarization layer 111 may be sequentially stacked on the semiconductor layer A1. The first gate insulating layer 103, the second gate insulating layer 105, and the interlayer insulating layer 107 may be the same as the first gate insulating layer 102, the second gate insulating layer 103, and the interlayer insulating layer 105 described with reference to FIG. 2. The first planarization layer 109 and the second planarization layer 111 may be the same as the planarization layer 107 described with reference to FIG. 2.

The gate electrode G1 is arranged on the first gate insulating layer 103 to overlap at least a portion of the semiconductor layer A1. The gate electrode G1 may include at least one of molybdenum (Mo), aluminum (Al), copper (Cu), and titanium (Ti) and have a single-layered structure or a multi-layered structure including the above materials. A lower electrode (not shown) of the storage capacitor Cst and the gate electrode G1 may be arranged in the same layer. The lower electrode and the gate electrode G1 may include the same material.

The organic light-emitting element 300 may be arranged on the second planarization layer 111. The organic light-emitting element 300 may form pixels P1, P2, and P3. The intermediate layer 320 of the organic light-emitting element 300 arranged in each of the pixels P1, P2, and P3 may be provided in common. Accordingly, the organic light-emitting element 300 included in each of the pixels P1, P2, and P3 may emit light of the same color. As an example, the intermediate layer 320 may include an organic emission layer including a fluorescent or phosphorous material emitting blue light. Functional layers may be arranged under and on the organic emission layer, the functional layers including a hole transport layer (HTL), a hole injection layer (HIL), an electron transport layer (ETL), and an electron injection layer (EIL).

The pixel-defining layer 112 may be arranged on the pixel electrode 310 of the organic light-emitting element 300. The intermediate layer 320 and the common electrode 330 may be arranged in the display area DA entirely on the pixel-defining layer 112 and the pixels P1, P2, and P3.

The thin-film encapsulation layer 500 may be arranged on the organic light-emitting element 300. The thin-film encapsulation layer 500 may include the first inorganic encapsulation layer 510, the organic encapsulation layer 520, and the second inorganic encapsulation layer 530.

An optical functional member (not shown) may be arranged on the thin-film encapsulation layer 500, the optical functional member facing the substrate 100. The optical functional member may include an upper substrate 800, color-converting layers (for example, the first and second color-converting layers QD1 and QD2, a transmission layer TW), and a light-blocking pattern 810. The upper substrate 800 may face the substrate 100, and the color-converting layers (for example, the first and second color-converting layers QD1 and QD2 and the transmission layer TW) may be disposed on the upper substrate 800.

The color-converting layers (for example, the first and second color-converting layers QD1 and QD2) may purify a color of light emitted from the organic light-emitting element 300, or convert color of the light into a different color. The color-converting layers, the first and second color-converting layers QD1 and QD2, may include a quantum-dot converting layer that may include quantum dots. A quantum dot is a semiconductor particle having a diameter of about 2 nm to about 10 nm and has unique electrical and optical properties. When exposed to light, a quantum dot may emit light in a frequency depending on the size of the particle, the kind of the material, and the like. As an example, when receiving light, a quantum dot may emit red, green, or blue light depending on the size of the particle and/or the kind of the material.

A core of the quantum dot may include a Group II-Group VI compound, a Group II-Group V compound, a Group IV-Group VI compound, a Group IV element, a Group IV compound, and a combination thereof.

A Group II-VI compound may include a two-element compound including CdSe, CdTe, ZnS, ZnSe, ZnTe, ZnO, HgS, HgSe, HgTe, MgSe, MgS, and a mixture thereof; a three-element compound including AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a four-element compound including HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

A Group III-V compound may include a two-element compound including GaN, GaP, GaAs, GaSb, AlN, AlP, AlAs, AlSb, InN, InP, InAs, InSb, and a mixture thereof; a three-element compound including GaNP, GaNAs, GaNSb, GaPAs, GaPSb, AlNP, AlNAs, AlNSb, AlPAs, AlPSb, InGaP, InNP, InNAs, InNSb, InPAs, InPSb, GaAlNP, and a mixture thereof; and a four-element compound including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof.

A Group IV-VI compound may include a two-element compound including SnS, SnSe, SnTe, PbS, PbSe, PbTe, and a mixture thereof; a three-element compound including SnSeS, SnSeTe, SnSTe, PbSeS, PbSeTe, PbSTe, SnPbS, SnPbSe, SnPbTe, and a mixture thereof; and a four-element compound including SnPbSSe, SnPbSeTe, SnPbSTe, and a mixture thereof. A Group IV element may include Si, Ge, and a mixture thereof. A Group IV compound may include a two-element compound including SiC, SiGe, and a mixture thereof.

The two-element compound, the three-element compound, or the four-element compound may be present inside a particle at a uniform concentration, or may be divided into areas with partially different concentration distributions within the same particle. A core-shell structure in which one quantum dot surrounds another quantum dot may also be provided. An interface between the core and the shell may have a concentration gradient in which the concentration of an element in the shell decreases toward the center.

In an embodiment, a quantum dot may have a core-shell structure including a core and a shell, the core including a nano crystal, and the shell surrounding the core. The shell of a quantum dot may serve as a protective layer that prevents a chemical change of the core to maintain semiconductor characteristics and/or serve as a charging layer for giving an electrophoretic characteristic to the quantum dot. The shell may include a single layer or a multi-layer. An interface between the core and the shell may have a concentration gradient in which the concentration of an element in the shell decreases toward the center. Examples of the shell of the quantum dot include oxide of metal or non-metal, a semiconductor compound, or a combination thereof.

As an example, though the oxide of metal or non-metal may include a two-element compounding including $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, $NiO$, or a three-element compound including $MgAl_2O_4$, $CoFe_2O_4$, $NiFe_2O_4$, and $CoMn_2O_4$, the embodiment is not limited thereto.

In addition, though the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, and AlSb, but the embodiment is not limited thereto.

A quantum dot may have a full width of half maximum (FWHM) of a light emission wavelength spectrum of about 45 nm or less, for example, about 40 nm or less, and about 30 nm or less. Within this range, color purity or color reproduction may be improved. Because light emitted from the quantum dot is emitted in all directions, a viewing angle of light may be improved.

Though the shape of the quantum dot is not particularly limited, the shape of the quantum dot may include a spherical shape, a pyramid shape, a multi-arm shape, or a cubic nano particle, a nano tube, a nano wire, a nano fiber, and a nano plate particle in an embodiment.

The color-converting layers, the first and second color-converting layers QD1 and QD2, may be arranged to correspond to at least a portion of an emission area defined by the opening OP of the pixel-defining layer 112. As an example, the first color-converting layer QD1 may correspond to an emission area of a first pixel P1, and the second color-converting layer QD2 may correspond to an emission area of a second pixel P2. The color-converting layer may not correspond to an emission area of a third pixel P3. The transmission layer TW may be arranged in the emission area of the third pixel P3. The transmission layer TW may include an organic material that may emit light without converting the wavelength of light emitted from the organic light-emitting element 300 of the third pixel P3. However, the embodiment is not limited thereto. A color-converting layer may be arranged also in an emission area EA of the third pixel P3.

Particles may be distributed in the color-converting layers, such as the first and second color-converting layers QD1 and QD2, and the transmission layer TW. Accordingly, color spreading may be uniform. The particles may include scatterers. As an example, the scatterers may include $TiO_2$.

The light-blocking pattern 810 may be arranged between the color-converting layers (the first and second color-converting layers QD1 and QD2 and the transmission layer TW). The light-blocking pattern 810 may be a black matrix and improve color clarity and contrast. The light-blocking pattern 810 may be arranged between the emission areas of the pixels, for example, the first pixel P1, the second pixel P2, and the third pixel P3. The light-blocking pattern 810 may include a black matrix that absorbs visible light, and prevents color mixing of light emitted from the emission areas of neighboring pixels and may improve visibility and contrast.

In an embodiment, the organic light-emitting elements may emit blue light. The first color-converting layer QD1 may include quantum dots that emit red light, and the second color-converting layer QD2 may include quantum dots that emit green light. Accordingly, light emitted to the outside of the display apparatus may be red, green, or blue color. Various color expressions may be possible through combinations of these colors.

A filling material 610 may be further arranged between the substrate 100 and the upper substrate 800. The filling material 610 may serve as a buffer against external pressure and the like. The filling material 610 may include an organic material such as methyl silicon, phenyl silicon, and polyimide. However, the filling material 610 is not limited thereto and may include a urethane-based resin, an epoxy-based resin, an acryl-based resin, which are organic sealants, or silicon, which is an inorganic sealant.

The display substrate S (refer to FIG. 5) may include the upper substrate 800 and the light-blocking pattern 810.

The display substrate S (refer to FIG. 5) may be arranged on a stage described below (refer to stage 1100 in FIG. 5) and then at least one of the color-converting layers, for example, the first and second color-converting layers QD1 and QD2 or the transmission layer TW, may be formed between the light blocking pattern 810. Hereinafter, the forming of the second color-converting layer QD2 is described in detail. The second color-converting layer QD2 may be formed by a nozzle (not shown) of one of the discharge parts (refer to discharge parts 4000 in FIG. 5) is described in detail.

To form the second color-converting layer QD2 corresponding to the emission areas EA emitting light of the same color (for example, the second color-converting layer QD2 of neighboring pixels PX), when liquid droplets are supplied from the nozzle of a discharge part, a controller (for example, the controller 6000 in FIG. 5) may adjust the position of the nozzle of the discharge part such that the liquid droplets are disposed on a portion of the display substrate S on which the second color-converting layer QD2 to be formed is arranged based on the concentration of particles included in the liquid droplets discharged from the nozzles. The emission areas EA emitting light of the same color may be defined as regions in which the final color of the light emitted through the color-converting layers (the first and second color-converting layers QD1 and QD2, or the transmission layer TW) is the same.

The controller (refer to FIG. 5) may control a variable moving distance of the discharge part. As an example, the controller may adjust a first moving distance of the discharge part and a second moving distance of the discharge part to be different from each other.

The above process may be similarly performed for second color-converting layers QD2 arranged at different positions of the display substrate S (refer to FIG. 5). In this case, the above process may be similarly performed for the first color-converting layer QD1 and the transmission layer TW, as well as the second color-converting layer QD2.

Through this, the concentration of particles included in each of the first color-converting layers QD1 emitting light of the same color, the concentration of particles included in each of the second color-converting layers QD2, and the concentration of particles included in each of the transmission layers TW may become uniform over the entire display substrate S (refer to FIG. 5).

When the forming of the color-converting layers, the first and second color-converting layers QD1 and QD2, on the light-blocking pattern 810 is completed, the filling material 610 is arranged on the color-converting layers, the first and second color-converting layers QD1 and QD2, and the filling material 610, and a display panel (the layers from the substrate 100 to the second inorganic encapsulation layer 530) are attached, and thus, the manufacturing of the display apparatus may be completed.

Figure 4:
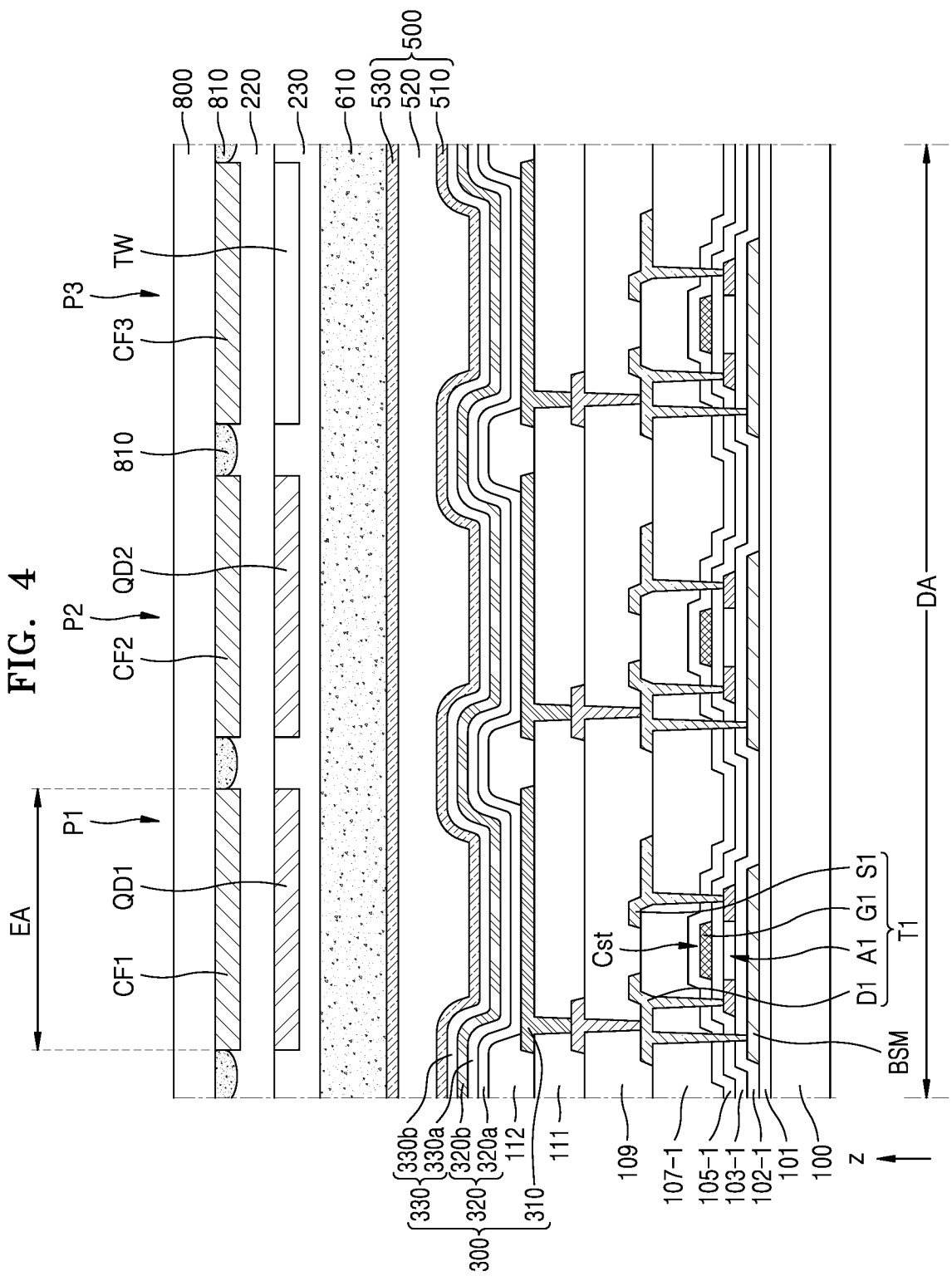
FIG. 4 is a schematic cross-sectional view of a portion of a display apparatus according to an embodiment.

FIG. 4 is a schematic cross-sectional view of a portion of a display apparatus according to an embodiment.

Referring to FIG. 4, the display apparatus may be similar to the display apparatus shown in FIG. 3. Hereinafter, differences from the display apparatus shown in FIG. 3 are described in detail.

The organic light-emitting elements 300 included in the pixels, the first to third pixels P1, P2, and P3, may include intermediate layers, first and second intermediate layers 320a and 320b, and common electrodes, first and second common electrodes 330a and 330b.

As an example, the organic light-emitting elements 300 may include the first intermediate layer 320a, the first common electrode 330a, the second intermediate layer 320b, and the second common electrode 330b that are sequentially stacked on the pixel electrode 310. The first intermediate layer 320a and the second intermediate layer 320b may each include an organic emission layer including a fluorescent or phosphorous material emitting red, green, blue, or white light. The organic emission layer may include a low molecular weight organic material or a polymer organic material. Functional layers may be selectively further arranged under and on the organic emission layer, the functional layers including a hole transport layer (HTL), a hole injection layer (HIL), an electron transport layer (ETL), and an electron injection layer (EIL). In an embodiment, the first intermediate layer 320a and the second intermediate layer 320b may each include an organic emission layer emitting blue light.

The first intermediate layer 320a and the second intermediate layer 320b may be light transmissive electrodes or reflective electrodes. In an embodiment, the common electrode 330 may be a transparent or semi-transparent electrode and may include a metal thin-film having a small work function and including at least one of Li, Ca, LiF/Ca, LiF/Al, Al, Ag, Mg, and a compound thereof. A transparent conductive oxide (TCO) may be further arranged on the metal thin-film, the TCO including ITO, IZO, ZnO, or $In_2O_3$. The first common electrode 330a may be a floating electrode.

The first intermediate layer 320a, the second intermediate layer 320b, the first common electrode 330a, and the second common electrode 330b may be formed as a single body over multiple pixels.

In an embodiment, color filters, first to third color filters CF1, CF2, and CF3, may be arranged on the upper substrate 800. The first to third color filters CF1, CF2, and CF3 may be introduced to implement full-color images and improve color purity and outside visibility.

The first to third color filters CF1, CF2, and CF3 may be arranged on the upper substrate 800 to respectively correspond to emission areas of the first to third pixels P1, P2, and P3. The light-blocking pattern 810 may be arranged between the first to third color filters CF1, CF2, and CF3.

A protection layer 220 may cover the light-blocking pattern 810 and the first to third color filters CF1, CF2, and CF3. The protection layer 220 may include an inorganic material including silicon oxide ($SiO_2$), silicon nitride ($SiN_x$), silicon oxynitride (SiON), aluminum oxide ($A_2O_3$), titanium oxide ($TiO_2$), tantalum oxide ($Ta_2O_5$), hafnium oxide ($HfO_2$), or zinc oxide ($ZnO_2$). The protection layer 220 may include an organic material including polyimide and epoxy.

The first color-converting layer QD1, the second color-converting layer QD2, and the transmission layer TW may respectively overlap the first color filter CF1, the second color filter CF2, and the third color filter CF3 with the protection layer 220 therebetween. An additional protection layer 230 may be further arranged over the upper substrate 800 to cover the first color-converting layer QD1, the second color-converting layer QD2, and the transmission layer TW. The additional protection layer 230 may include an organic material or an inorganic material.

The first color-converting layer QD1 and the second color-converting layer QD2 may respectively include quantum dots emitting light of different colors. As an example, the first color-converting layer QD1 may emit red light, and the second color-converting layer QD2 may emit green light. The transmission layer TW may transmit blue light emitted from the organic light-emitting element 300 of the third pixel P3.

The first color filter CF1 may be a red color filter, the second color filter CF2 may be a green color filter, and the third color filter CF3 may be a blue color filter.

The display substrate S (refer to FIG. 5) may include the upper substrate 800, the light-blocking pattern 810, the first to third color filters CF1, CF2, and CF3, and the protection layer 220. The display substrate S may be manufactured by forming the light-blocking pattern 810 on the upper substrate 800, and then arranging the first to third color filters CF1, CF2, and CF3 in the light-blocking patterns, and forming the protection layer 220 on the first to third color filters CF1, CF2, and CF3 and the light-blocking pattern 810.

In the display substrate S (refer to FIG. 5), at least one of the color-converting layers, that is, the first and second color-converting layers QD1 and QD2, and the transmission layer TW may be formed by the apparatus 1000 (refer to FIG. 5) for manufacturing a display apparatus described below. Hereinafter, the case where the second color-converting layer QD2 is formed on the display substrate S is described in detail. The case where the second color-converting layer QD2 is formed by a first nozzle 4100*a* of a first discharge part 4000*a* (refer to FIGS. 8 and 5) is described in detail.

The second color-converting layer QD2 may be formed by supplying liquid droplets through the first nozzle 4100*a* (refer to FIG. 8 and FIG. 5) on the display substrate S (refer to FIG. 5). The second color-converting layers QD2 may implement the same color. The controller 6000 (refer to FIG. 5) may change the position of the nozzle passing over a portion of the display substrate S on which the second color-converting layer QD2 is to be arranged such that the concentration of particles that are to be included in the second color-converting layer QD2 is uniform. For example, to form the second color-converting layer QD2 implementing the same color, the controller 6000 (refer to FIG. 5) may adjust a distance by which the first discharge part moves such that a number of the first nozzle is uniform to some degree in each second color-converting layer QD2. The first nozzle 4100*a* (refer to FIG. 8) may supply liquid droplets.

Because the above operation is repeatedly performed on the entire display substrate S (refer to FIG. 5), multiple second color-converting layers QD2 may be formed on the display substrate S. The concentration of particles included in each second color-converting layer QD2 may substantially be the same over the entire display substrate S (refer to FIG. 5).

The above operation may be equally performed for the first color-converting layer QD1 and the transmission layer TW.

Accordingly, while the first and second color-converting layers QD1 and QD2 each emitting light of their respective colors are formed by the above process, the concentration of particles included in the first and second color-converting layers QD1 and QD2 may be adjusted to be uniform over the entire display substrate S (refer to FIG. 5).

The first and second color-converting layers QD1 and QD2 and the transmission layer TW are formed on the display substrate S, and then, the additional protection layer 230 may be formed or the additional protection layer 230 and the filling material 610 may be formed on the color-converting layers, that is, the first and second color-converting layers QD1 and QD2 and the transmission layer TW, and the display substrate S (refer to FIG. 5) may be attached to a display panel (not shown). In this case, the display panel may conceptually be from the substrate 100 to the second inorganic encapsulation layer 530 of FIG. 4.

Similar to the manner in which first and second color-converting layers QD1 and QD2 are formed, the first to third color filters CF1, CF2, and CF3 may also be formed by the manufacturing apparatus for a display apparatus described below. The display substrate S (refer to FIG. 5) may include the upper substrate 800 and the light-blocking pattern 810. The concentration of particles included in the first to third color filters CF1, CF2, and CF3 may be adjusted to be substantially uniform, as described above.

The first to third color filters CF1, CF2, and CF3 are formed, and then, from the protection layer 220 to the additional protection layer 230 may be formed, or from the protection layer 220 to the filling material 610 may be formed on the display substrate S (refer to FIG. 5), the first to third color filters CF1, CF2, and CF3, and the display panel(not shown) may be attached.

Figure 6:
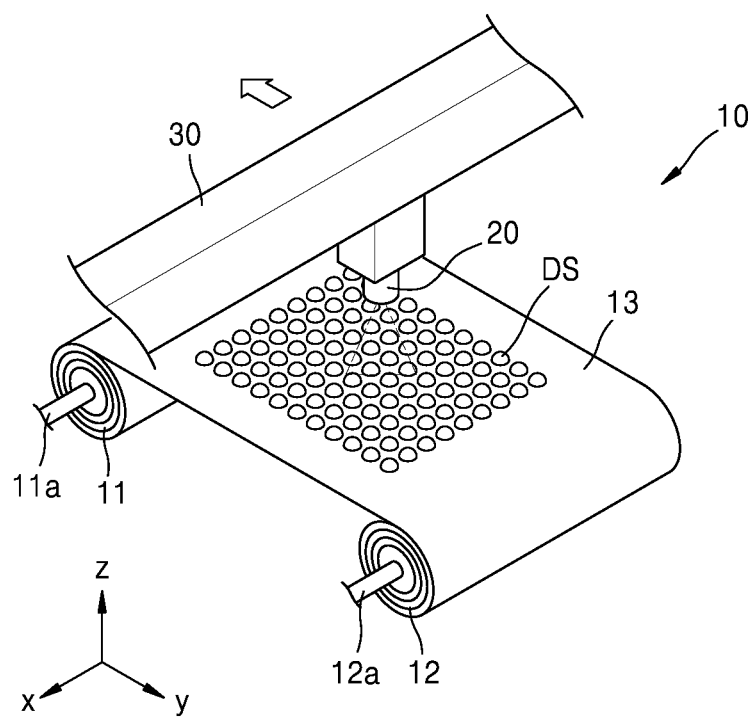
FIG. 6 is a schematic perspective view of a measuring part shown in FIG. 5.

FIG. 5 is a schematic perspective view of a manufacturing apparatus for a display apparatus according to an embodiment. FIG. 6 is a schematic perspective view of the measuring part shown in FIG. 5.

Referring to FIGS. 5 and 6, the apparatus 1000 for manufacturing a display apparatus may include a stage 1100, a first gantry 2000, a moving part 3000, a droplet discharge part 4000, a droplet-measuring part 5000, and a controller 6000.

The stage 1100 may include a guide member 1200 and a substrate-moving member 1300. The stage 1100 may include an alignment mark (not shown) for aligning the display substrate S.

The display substrate S may be a display apparatus that is being manufactured. As an example, the display substrate S may be a display apparatus being manufactured and include layers from the substrate 100 to the pixel-defining layer 112 described in FIGS. 2 through 4. The apparatus 1000 for manufacturing a display apparatus may form an organic emission layer including particles on the display substrate S. In another examples, the display substrate S may be a display apparatus being manufactured including the upper substrate 800 and the light-blocking pattern 810 shown in FIG. 3 or including the upper substrate 800, the light-blocking pattern 810, the first to third color filters CF1, CF2, and CF3, and the protection layer 220 from FIG. 4. The apparatus 1000 for manufacturing a display apparatus may arrange the first and second color-converting layers QD1 and QD2 including particles between the light-blocking patterns 810 on the display substrate S. In other embodiments, the display substrate S may be a display apparatus being manufactured including the upper substrate 800 and the light-blocking pattern 810 shown in FIG. 4. The apparatus 1000 for manufacturing a display apparatus may be form the first to third color filters CF1, CF2, and CF3 including particles on the upper substrate 800. Hereinafter, the case where the display substrate S is the display apparatus being manufactured including the upper substrate 800 and the light-blocking pattern 810, and the first and second color-converting layers QD1 and QD2 are formed on the display substrate S is described in detail.

The guide members 1200 may be spaced apart from each other on two opposite sides with the substrate-moving member 1300 therebetween. The length of the guide member 1200 may be greater than the length of the edge of the display substrate S. The length of the guide member 1200 and the length of the edge of the display substrate S may be measured in a y-direction of FIG. 5.

The first gantry 2000 may be arranged on the guide member 1200. In an embodiment, the guide member 1200 may include a constant rail such that the first gantry 2000 linearly moves in a lengthwise direction of the guide member 1200. The guide member 1200 may include a linear motion rail.

The substrate-moving member 1300 may be arranged on the stage 1100 and may include a substrate-rotating member 1400. The substrate-moving member 1300 may extend in the lengthwise direction of the guide member 1200. As an example, referring to FIG. 5, the substrate-moving member 1300 may extend in the y-direction. The substrate-moving member 1300 may include a rail such that the substrate-rotating member 1400 linearly moves. The substrate-moving member 1300 may include a linear motion rail.

The substrate-rotating member 1400 may rotate on the substrate-moving member 1300. When the substrate-rotating member 1400 rotates, the display substrate S disposed on the substrate-rotating member 1400 may rotate. In an embodiment, the substrate-rotating member 1400 may rotate about a rotational axis perpendicular to one side of the stage 1100 on which the display substrate S is seated. When the substrate-rotating member 1400 rotates about a rotational axis perpendicular to one side of the stage 1100 on which the display substrate S is seated, the display substrate S arranged on the substrate-rotating member 1400 may also rotate about the rotational axis perpendicular to one side of the stage 1100 on which the display substrate S is seated.

The first gantry 2000 may be arranged on the guide member 1200. For example, the first gantry 2000 may be arranged on the guide members 1200 apart from each other on two opposite sides with the substrate-moving member 1300 therebetween.

The first gantry 2000 may move in the lengthwise direction of the guide member 1200. In an embodiment, the first gantry 2000 may linearly move manually or linearly move automatically by including a motor cylinder and the like. As an example, the first gantry 2000 may linearly move automatically by including a linear motion block moving along a linear motion rail.

The moving part 3000 and the droplet discharge part 4000 configured to discharge liquid droplets DS may be arranged on the first gantry 2000. In an embodiment, the moving part 3000 may linearly move on the first gantry 2000. As an example, the first gantry 2000 may include a constant rail such that the moving part 3000 may linearly move.

The moving part 3000 may include at least one nozzle-moving unit, and at least one discharge part of the droplet discharge part 4000 may be arranged in various methods. The moving part 3000 may linearly move on the first gantry 2000, and the droplet discharge part 4000 may be arranged on the moving part 3000 and supply liquid droplets DS to the display substrate S. As an example, a nozzle-moving unit may be provided for each the discharge part. The discharge part 4000 may include at least one nozzle head discharging liquid droplets DS.

As another example, at least one discharge part may be provided, and one nozzle-moving unit may be provided. In this case, when multiple discharge parts are provided, the discharge parts may be arranged on a single nozzle-moving unit. Accordingly, as the nozzle-moving unit moves, the discharge parts may move simultaneously.

As another example, multiple nozzle-moving units may be provided, and multiple discharge parts may be provided. At least one discharge part may be arranged on a nozzle-moving unit. Hereinafter, the discharge part is described in detail where a discharge part is arranged on each of the nozzle-moving units is described in detail.

The moving part 3000 may include multiple nozzle-moving units. In an embodiment, the moving part 3000 may include a first nozzle-moving unit 3000*a*, a second nozzle-moving unit 3000*b*, and a third nozzle-moving unit 3000*c*. In an embodiment, the moving part 3000 may include at least one nozzle-moving unit or include four or more nozzle-moving units. The moving part 3000 will be described as including the first nozzle-moving unit 3000*a*, the second nozzle-moving unit 3000*b*, and the third nozzle-moving unit 3000*c*.

In an embodiment, an interval between the first nozzle-moving unit 3000*a* and the second nozzle-moving unit 3000*b* may be the same as an interval between the second nozzle-moving unit 3000*b* and the third nozzle-moving unit 3000*c*. In other embodiments, the interval between the first nozzle-moving unit 3000*a* and the second nozzle-moving unit 3000*b* may be different from the interval between the second nozzle-moving unit 3000*b* and the third nozzle-moving unit 3000*c*.

The moving part 3000 may linearly move on the first gantry 2000. The moving part 3000 may move in the lengthwise direction of the first gantry 2000. As an example, at least one of the first nozzle-moving unit 3000*a*, the second nozzle-moving unit 3000*b*, and the third nozzle-moving unit 3000*c* may move in an x-direction or a (−) x-direction, opposite the x-direction.

In an embodiment, the moving part 3000 may linearly move manually. In other embodiments, the moving part 3000 may linearly move automatically by including a motor, a cylinder, and the like. As an example, the moving part 3000 may include a linear motion block moving along a linear motion rail. Hereinafter, the moving part 3000 is described as linearly moving automatically.

A discharge part of the droplet discharge part 4000 may be arranged on the nozzle-moving unit of the moving part 3000. In this case, the discharge part of the droplet discharge part 4000 may be configured to supply liquid droplets DS to the display substrate S. In this case, the discharge part of the droplet discharge part 4000 may be configured to supply various materials to the display substrate S. As an example, the first discharge part 4000*a* may be arranged on the first nozzle-moving unit 3000*a*. As another example, the second discharge part 4000*b* may be arranged on the second nozzle-moving unit 3000*b*. As another example, the third discharge part 4000*c* may be arranged on the third nozzle-moving unit 3000*c*.

In this case, at least one of the first discharge part 4000*a*, the second discharge part 4000*b*, and the third discharge part 4000*c* may include multiple heads. Each head may include at least one nozzle discharging liquid droplets DS. Hereinafter, each of the first discharge part 4000*a*, the second discharge part 4000*b*, and the third discharge part 4000*c* will be described as including multiple heads, and each head including multiple nozzles.

The droplet discharge part 4000 may discharge liquid droplets DS to the display substrate S or an inspection board 10. The liquid droplets DS may include liquid crystals, orientation solution including particles, and red, green, blue, colorless ink in which pigment particles (e.g., dye) are mixed in a solvent. In other embodiments, the liquid droplets DS may include a polymer organic material or a low molecular weight organic material corresponding to an emission layer of an organic light-emitting display apparatus including scatterers. In other examples, the liquid droplets DS may include a color-converting material including particles or a color filter material including particles. The liquid droplets DS may include quantum dots and particles. Hereinafter, the liquid droplets DS will be described as including particles and quantum dots.

In each of the first discharge part 4000a, the second discharge part 4000b, and the third discharge part 4000c, a discharged amount of liquid droplets DS may be adjusted independently. Each of the first discharge part 4000a, the second discharge part 4000b, and the third discharge part 4000c may be electrically connected to the controller 6000. Accordingly, in each of the first discharge part 4000a, the second discharge part 4000b, and the third discharge part 4000c, a discharged amount of liquid droplets DS may be adjusted by the controller 6000.

The droplet-measuring part 5000 may measure liquid droplets DS discharged from the droplet discharge part 4000. The droplet-measuring part 5000 may photograph an image of liquid droplets DS discharged from the droplet discharge part 400 and seated on the display substrate S.

The droplet-measuring part 5000 may include the inspection board 10, a measuring part 20, and a second gantry 30.

The inspection board 10 may be arranged on the stage 1100. The inspection board 10 may be arranged between the guide members 1200. In the embodiment, the apparatus 1000 for manufacturing a display apparatus may include at least one inspection board 10. As an example, the apparatus 1000 for manufacturing a display apparatus may include multiple inspection boards 10. Accordingly, amounts of liquid droplets DS discharged from multiple discharge parts may be simultaneously inspected, and thus, efficiency of the inspection of liquid droplets DS may be improved.

The inspection board 10 may include a film-supplying part 11 and a film-collecting part 12. The film-supplying part 11 may be spaced apart from the film-collecting part 12. In the embodiment, the film-supplying part 11 may be apart from the film-collecting part 12 in the lengthwise direction of the guide member 1200. As an example, the film-supplying part 11 may be apart from the film-collecting part 12 in the y-direction. In this case, the film-supplying part 11 and the film-collecting part 12 may be connected and fixed to the ground, a building inner portion and the like.

The film-supplying part 11 may be configured to supply a test member 13. In this case, the test member 13 may have a film shape. The test member 13 may be arranged in the film-supply part 11 in a roll type. In other words, the test member 13 may be wound around the film-supplying part 11. The film-supplying part 11 may include a first shaft 11a. The first shaft 11a may rotate and supply the test member 13. The first shaft 11a may be connected to a driver. In this case, the driver may include a motor. In another embodiment, the driver may include a structure of a cylinder and a cam. In this case, the driver is not limited thereto and may include all structures and apparatuses that may be connected to the first shaft 11a and may rotate the first shaft 11a. Accordingly, the first shaft 11a may be rotated by the driver.

The film-collecting part 12 may collect the test member 13. Specifically, the film-collecting part 12 may collect the test member 13 supplied by the film-supplying part 11. The test member 13 may be arranged on the film-collecting part 12 in a roll type. That is, the test member 13 for which measurement of discharged liquid droplets DS has been completed may be wound on the film-collecting part 12. The film-collecting part 12 may include a second shaft 12a. The second shaft 12a may rotate and collect the test member 13. The second shaft 12a may be connected to a driver. In this case, the driver may be the same as or similar to the driver connected to the first shaft 11a. Accordingly, the second shaft 12a may be rotated by the driver.

The test member 13 may be supplied by the film-supplying part 11 and collected by the film-collecting part 12. Accordingly, when inspection of liquid droplets DS discharged on a portion of the test member 13 is completed, the film-supplying part 11 and the film-collecting part 12 may move the portion of the test member 13, thereby changing the position of the test member 13 such that another portion of the test member 13 faces the droplet discharge part 4000. Here, the test member 13 may include a material that is the same as or similar to that of the display substrate S. As an example, the test member 13 may include a film including a polymer resin such as polyethersulfone, polyarylate, polyetherimide, polyethylene naphthalate, polyethylene terephthalate, polyphenylene sulfide, polyimide, polycarbonate (PC), cellulose tri acetate (TAC), and cellulose acetate propionate.

In the embodiment, though it is described that the inspection board 10 includes the film-supplying part 11 and the film-collecting part 12, the inspection board 10 may include an inspection substrate. The inspection substrate may be replaced by a robot arm. The inspection substrate may include a material that is the same as or similar to that of the display substrate S or the test member 13.

The measuring part 20 may photograph liquid droplets DS on the test member 13. The measuring part 20 may be electrically connected to the controller 6000 to transmit a photographed image to the controller 6000.

The measuring part 20 may be a confocal microscope or an interferometric microscope. A confocal microscope may obtain multiple two-dimensional images of an object at different depths and reconstruct a three-dimensional structure of the object based on this. Examples of a confocal microscope may include a chromatic confocal microscope, a chromatic line confocal microscope and the like. An interferometric microscope observes and quantitatively measures a change of fine structure unevenness, a change of a phase and the like of an object. Examples of an interferometric microscope may include a laser interferometric microscope, a white light interferometric microscope, and the like. In an embodiment, the measuring part 20 may include a lighting (not shown), a lens (not shown), and a camera (not shown). The measuring part 20 may be arranged in a configuration of the lighting, the lens, and the camera from a part close to liquid droplets DS. The measuring part 20 is not limited thereto and may include apparatuses and structures configured to photograph images of liquid droplets DS on the test member 13. Hereinafter, the measuring part 20 will be described as including the lighting, the lens, and the camera.

The droplet-measuring part 5000 may include at least one measuring part 20. As an example, the droplet-measuring part 5000 may include multiple measuring parts 20. Accordingly, amounts of liquid droplets DS discharged from multiple discharge parts may be simultaneously inspected, and thus, efficiency of the inspection of liquid droplets DS may be improved.

The measuring part 20 may linearly move along the second gantry 30 and linearly move together with the second gantry 30. The measuring part 20 may move in the lengthwise direction of the second gantry 30. As an example, the measuring part 20 may move in the x-direction or opposite the x-direction of FIG. 5. The measuring part 20 may linearly move together with the second gantry 30 as the second gantry 30 moves. As an example, the measuring part 20 may move in the y-direction or the (−) y-direction of FIG. 5 together with the second gantry 30.

The second gantry 30 may be arranged on the guide member 1200. For example, similar to the first gantry 2000, the second gantry 30 may be arranged on the guide members 1200 apart from each other with the inspection board 10 therebetween.

The second gantry 30 may move in the lengthwise direction of the guide member 1200. In an embodiment, the second gantry 30 may linearly move manually or linearly move automatically by including a motor cylinder and the like. As an example, the second gantry 30 may linearly move automatically by including a linear motion block moving along a linear motion rail.

Though it is shown that the measuring part 20 is connected to the second gantry 30, the first gantry 2000 and the second gantry 30 may be provided as a single body in other embodiments. The measuring part 20 may be spaced apart from the moving part 3000. In other examples, similar to the droplet discharge part 4000, the measuring part 20 may be arranged on the moving part 3000. Here, f the apparatus 1000 for manufacturing a display apparatus will be described as including the second gantry 30, and the measuring part 20 being connected to the second gantry 30.

The controller 6000 may calculate the brightness of liquid droplets DS by using an image of the liquid droplets DS photographed by the measuring part 20. The controller 6000 may calculate the concentration of particles included in the liquid droplets DS based on the calculated brightness of the liquid droplets DS. In an embodiment, after the controller 6000 divides the photographed brightness of liquid droplets DS by the brightness of a portion of the test member 13 where there are no liquid droplets DS, or after the controller 6000 adjusts the brightness of an entire image, the controller 6000 may calculate the brightness of the liquid droplets DS and calculate the concentration of particles included in the liquid droplets DS based on this. The controller 6000 may average the brightness of the photographed liquid droplets DS over the entire surface of the liquid droplets DS and calculate the concentration of particles included in the liquid droplets DS based on this. In other examples, the controller 6000 may calculate the brightness of the remaining portion of liquid droplets DS except for a region where reflection occurs in a photographed image of the liquid droplets DS, and then calculate the concentration of particles included in the liquid droplets DS based on this. In other examples, the controller 6000 may average brightness of a preset region including a planar shape of liquid droplets DS, and then calculate the concentration of particles included in the liquid droplets DS based on this. For example, the controller 6000 may divide the brightness of a portion including liquid droplets DS in a photographed image by the brightness of a portion not including the liquid droplets DS or the brightness of the entire image to perform normalization and calculate a corrected brightness of the liquid droplets DS, and then calculate the concentration of particles included in the liquid droplets DS based on the corrected brightness.

The controller 6000 may store the concentration of particles included in calculated liquid, and then linearly move the first gantry 2000 on the guide member 1200, thereby arranging the first nozzle-moving unit 3000a, the second nozzle-moving unit 3000b, and the third nozzle-moving unit 3000c to correspond to the display substrate S.

The controller 6000 may linearly move the first nozzle-moving unit 3000a, the second nozzle-moving unit 3000b, and the third nozzle-moving unit 3000c on the first gantry 2000, thereby arranging the first discharge part 4000a, the second discharge part 4000b, and the third discharge part 4000c to correspond to the display substrate S.

The first discharge part 4000a, the second discharge part 4000b, and the third discharge part 4000c may be configured to supply liquid droplets DS to the display substrate S. The controller 6000 may arrange the first discharge part 4000a, the second discharge part 4000b, and the third discharge part 4000c at corresponding positions of the display substrate S and then supply liquid droplets DS to the display substrate S. The controller 6000 may control the concentration of all particles included in the liquid droplets DS disposed on a part of the display substrate S by controlling the positions of the first discharge part 4000a, the second discharge part 4000b, and the third discharge part 4000c.

The controller 6000 may position the first discharge part 4000a, the second discharge part 4000b, and the third discharge part 4000c over the display substrate S and linearly move the display substrate S in the first direction (e.g., the (+) y-direction of FIG. 5). The display substrate S may move at a preset speed, or may repeatedly move by a preset distance and then move by a preset distance. When the display substrate S completely passes through a space in which the first discharge part 4000a, the second discharge part 4000b, and the third discharge part 4000c are arranged, the controller 6000 may separate the first discharge part 4000a, the second discharge part 4000b, and the third discharge part 4000c in the second direction (e.g., the (+) x-direction of FIG. 5) by a first distance. While the controller 6000 linearly moves the display substrate S in a direction (e.g., the (−) y-direction of FIG. 5) opposite to the first direction, the first discharge part 4000a, the second discharge part 4000b, and the third discharge part 4000c may supply liquid droplets DS. When the above process is completed, the controller 6000 may move the first discharge part 4000a, the second discharge part 4000b, and the third discharge part 4000c again in the second direction by a second distance and then linearly move the display substrate S, thereby supplying liquid droplets DS on the display substrate S. The controller 6000 may repeatedly perform the above operation. The controller 6000 may control moving distances of the first discharge part 4000a, the second discharge part 4000b, and the third discharge part 4000c. As an example, the controller 6000 may control the moving distances of the first discharge part 4000a, the second discharge part 4000b, and the third discharge part 4000c not to be constant. The controller 6000 may control the first distance to be different from the second distance.

In the case where the controller 6000 controls the first distance to be different from the second distance, nozzles may be arranged such that a frequency at which nozzles with different concentrations are arranged is nearly similar or the same for each emission area among nozzles supplying liquid droplets DS to a portion of an emission area emitting light of the same color. For example, because the controller 6000 controls moving distances of the first discharge part 4000a, the second discharge part 4000b, and the third discharge part 4000c in the second direction to be different from each other as described above, nozzles with different concentrations may be arranged in a portion of the display substrate S corresponding to the emission area emitting light of the same color at the same or similar frequency.

Accordingly, the apparatus 1000 for manufacturing a display apparatus may supply liquid droplets DS such that the concentration of particles included in a layer arranged in the emission area EA of the display substrate S is uniform.

Figure 7:
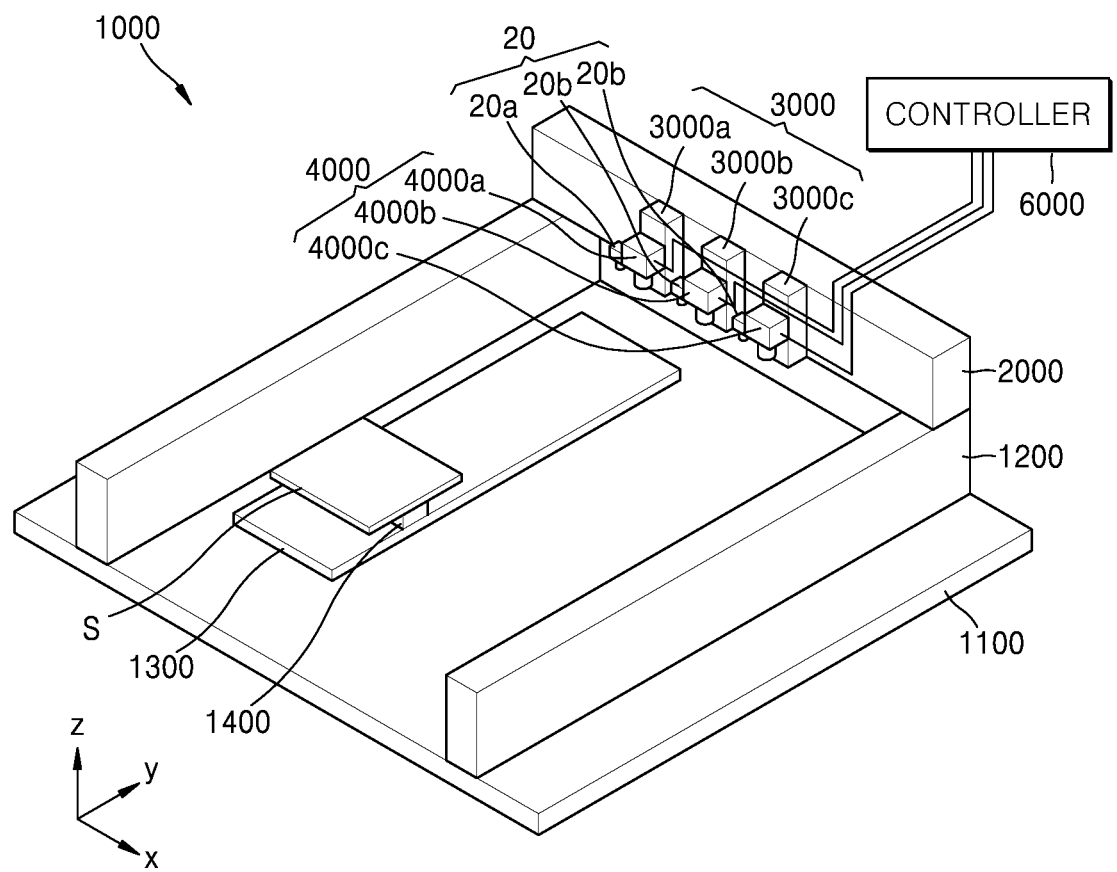
FIG. 7 is a schematic perspective view of a manufacturing apparatus for a display apparatus according to an embodiment.

FIG. 7 is a perspective view of a manufacturing apparatus for a display apparatus according to an embodiment.

Referring to FIG. 7, the apparatus 1000 for manufacturing a display apparatus may include the stage 1100, the first gantry 2000, the moving part 3000, the droplet discharge part 4000, the measuring part 20, and the controller 6000. The stage 1100, the first gantry 2000, the moving part 3000, the droplet discharge part 4000, and the controller 6000 are substantially the same or similar to those described with reference to FIG. 5.

The measuring part 20 may be movably connected to the first gantry 2000. The measuring part 20 may be connected to the moving part 3000 to move together with the droplet discharge part 4000. In an embodiment, a separate moving part similar to the moving part 3000 may be provided to the first gantry 2000, and the measuring unit 20 may be arranged on the moving part 3000 and linearly move along the first gantry 2000. Hereinafter, the measuring part 20 will be described as being arranged on the moving part 3000.

At least one measuring part 20 may be provided. As an example, one measuring part 20 may be provided and one measuring part 20 may be arranged on the first nozzle-moving unit 3000*a*, the second nozzle-moving unit 3000*b*, or the third nozzle-moving unit 3000*c*. In other embodiments, multiple measuring parts 20 may be provided. The measuring parts 20 may be arranged on each nozzle-moving unit. As an example, the measuring part 20 may include a first measuring part 20*a*, a second measuring part 20*b*, and a third measuring part 20*c*, the first measuring part 20*a* being on the first nozzle-moving unit 3000*a*, the second measuring part 20*b* being on the second nozzle-moving unit 3000*b*, and the third measuring part 20*c* being on the third nozzle-moving unit 3000*c*. The first measuring part 20*a* may move together with the first discharge part 4000*a*, the second measuring part 20*b* may move together with the second discharge part 4000*b*, and the third measuring part 20*c* may move together with the third discharge part 4000*c*. Hereinafter, the measuring part 20 is described as including the first measuring part 20*a*, the second measuring part 20*b*, and the third measuring part 20*c*.

The first discharge part 4000*a*, the second discharge part 4000*b*, and the third discharge part 4000*c* may supply liquid droplets (not shown) to the display substrate S. In an embodiment, as a method of supplying the liquid droplets, with the display substrate S fixed, the first discharge part 4000*a*, the second discharge part 4000*b*, and the third discharge part 4000*c* reciprocate in one direction (e.g., the y-axis direction of FIG. 7) and supply the liquid droplets to the display substrate S. In addition, the first discharge part 4000*a*, the second discharge part 4000*b*, and the third discharge part 4000*c* may move by a preset interval in the lengthwise direction of the first gantry 2000, and then move in the same direction (e.g., the y-axis direction of FIG. 7) described above to supply the liquid droplets to another region of the display substrate S. In other embodiments, the first discharge part 4000*a*, the second discharge part 4000*b*, and the third discharge part 4000*c* may move in the x-axis direction of FIG. 7 over the display substrate S, and supply the liquid droplets to the display substrate S while the display substrate S moves in the y-axis direction. Hereinafter, the display substrate S will be described as reciprocating in the y-axis direction of FIG. 7 and the first discharge part 4000*a*, the second discharge part 4000*b*, and the third discharge part 4000*c* move by a preset interval in the x-axis direction of FIG. 7 to supply the liquid droplets to the display substrate S The first discharge part 4000*a*, the second discharge part 4000*b*, and the third discharge part 4000*c* may each include multiple head parts. Each head part may include multiple nozzles.

The manufacturing apparatus for a display apparatus may arrange the display substrate S on the stage 1100, supply the liquid droplets to the display substrate S through the first discharge part 4000*a*, the second discharge part 4000*b*, and the third discharge part 4000*c*, photograph an image of the display substrate S by using the measuring part 20, and then calculate the concentration of particles included in the liquid droplets. The method of calculating the concentration of particles included in the liquid droplets is substantially the same as or similar to the method described above with reference to FIG. 5.

To calculate the concentration of the particles, the liquid droplets are supplied to the entire region of the display substrate S or a preset region of the display substrate S from all nozzles of all discharge parts, and then measured by the measuring part, so that the concentration of the particles included in the liquid droplets discharged from each nozzle may be calculated.

Through the calculated concentration, the controller 6000 may control a moving distance of the first discharge part 4000*a*, the second discharge part 4000*b*, and the third discharge part 4000*c* such that a nozzle corresponding to each emission area supplies liquid droplets at a uniform concentration at an emission area emitting light of the same color. In case that the first discharge part 4000*a*, the second discharge part 4000*b*, and the third discharge part 4000*c* are moved multiple times, the controller 6000 may control one of the moving distances to be different from other moving distances. Some of the nozzles may be arranged on each portion of the display substrate S corresponding to the emission area emitting light of the same color such that the concentration becomes uniform to some extent.

Accordingly, the apparatus 1000 for manufacturing a display apparatus may maintain the concentration of particles included total liquid droplets to be the same as or similar to each other in a portion of the display substrate S corresponding to the emission area emitting light of the same color, the total liquid droplets being arranged on the entire display substrate S entirely and supplied to each portion of the display substrate S corresponding to an emission area emitting light of the same color.

The above operation may be used in one display substrate S or performed on multiple display substrates S. As an example, measurement of the concentration of particles included in liquid droplets discharged from each nozzle to one display substrate S as described above, and the motion of the droplet discharge part 4000 over another display substrate S may be controlled based on this. Furthermore, because these contents are fed back to the controller 6000 after an operation on one display substrate S is completed, the concentration of particles included in the liquid droplets discharged from each discharge part or nozzles of each discharge part may be monitored in real-time.

Accordingly, the apparatus 1000 for manufacturing a display apparatus may control the concentration of particles to be uniform over the entire surface.

Hereinafter, the first discharge part 4000*a*, the first head part (not shown), and the first nozzle part (not shown) are described in detail.

Figure 8:
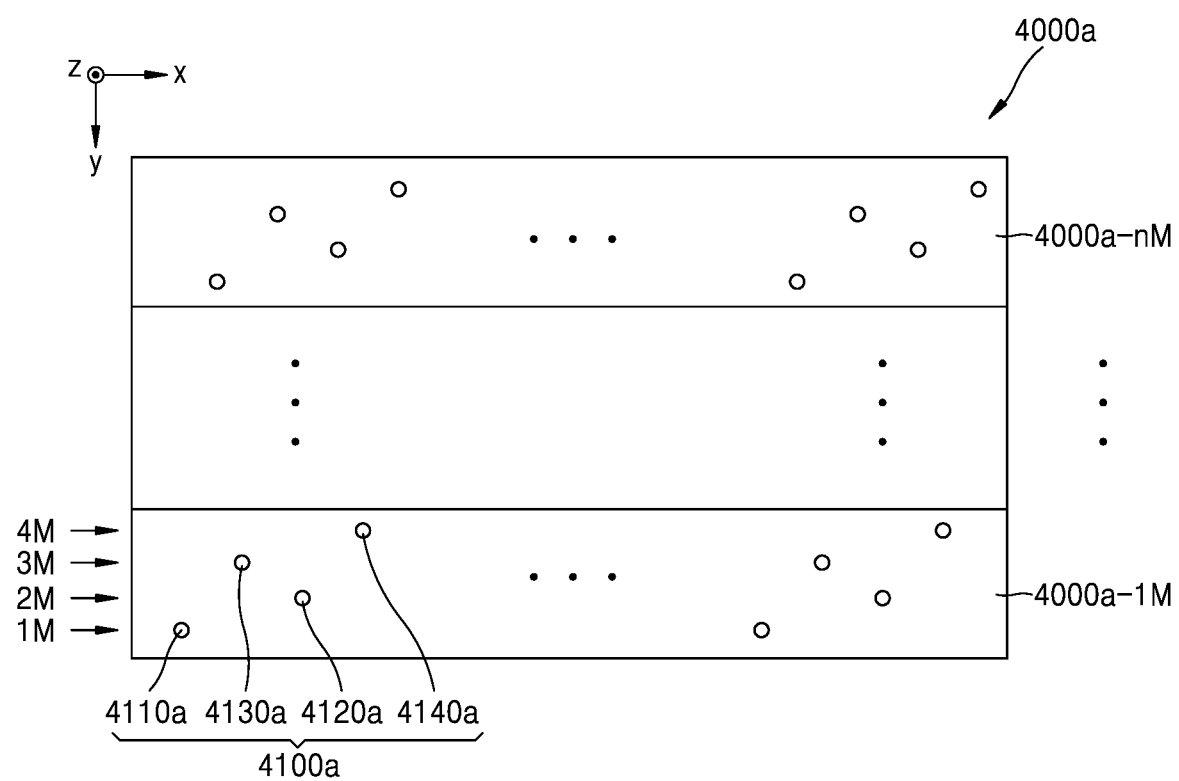
FIG. 8 is a schematic backside view of a portion of a discharge part of FIG. 5 or 7.
Figure 9:
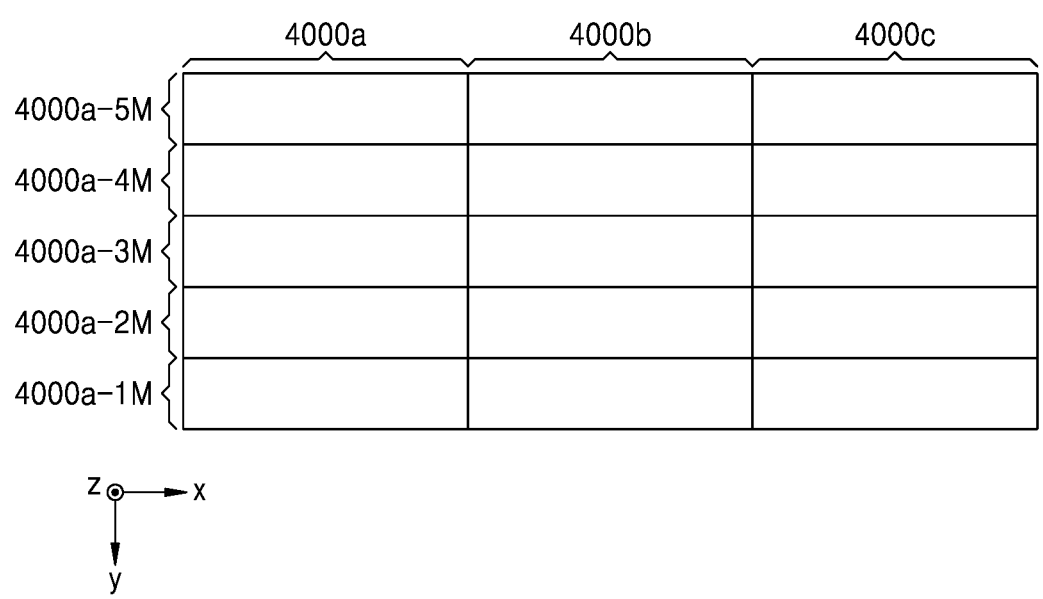
FIG. 9 is a schematic backside view of the discharge part of FIG. 5 or 7.
Figure 10:
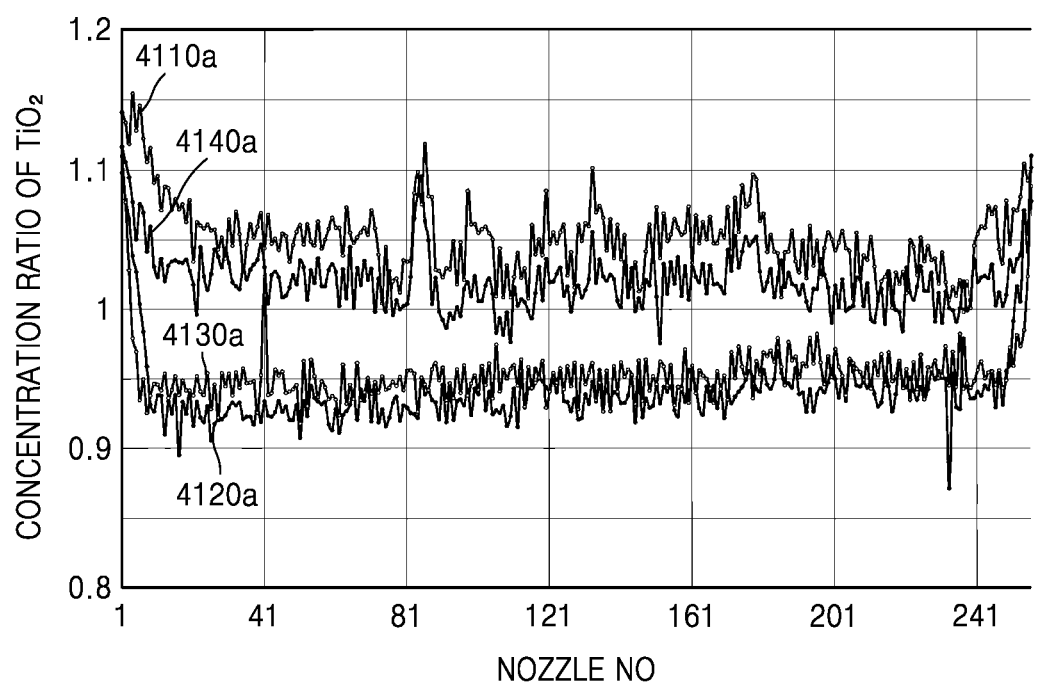
FIG. 10 is a graph showing measured concentration of scatterers included in liquid droplets sprayed from each nozzle shown in FIG. 8.

FIG. 8 is a backside view of a portion of a discharge part of FIG. 5 or 7. FIG. 9 is a backside view of a discharge part of FIG. 5 or 7. FIG. 10 is a graph showing measured concentration of scatterers included in liquid droplets sprayed from each nozzle shown in FIG. 8.

Referring to FIGS. 8 to 10, the first discharge part 4000*a* may include at least one first head part (not shown). Hereinafter, the first discharge part 4000*a* will be described to include multiple first head parts (not shown) and multiple first head parts are arranged in a line in the first direction. The first head parts may be arranged in a line in the first direction. N number of first head parts (where N is a natural number) may be arranged. As an example, from a (1-1)st head part 4000*a*-1M to a (1-N)th head part 4000*a*-nM may be arranged in a line in the first direction (where N is a natural number). Hereinafter, for convenience of description, the case where the first head part includes the (1-1)st head part 4000*a*-1M, a (1-2)nd head part 4000*a*-2M, a (1-3)rd head part 4000*a*-3M, a (1-4)th head part 4000*a*-4M, and a (1-5)th head part 4000*a*-5M is described in detail.

Each first head part may include multiple first nozzles 4100*a*. The first nozzles 4100*a* may be spaced apart from each other and arranged in a zigzag pattern. As an example, the first nozzles 4100*a* may include the (1-1)st nozzle 4110*a* arranged on a first column 1M in the lower portion of FIG. 8. In addition, the first nozzles 4100*a* may include a (1-2)nd nozzle 4120*a* arranged on a second column 2M. The first nozzles 4100*a* may include a (1-3)rd nozzle 4130*a* arranged on a third column 3M, and a (1-4)th nozzle 4140*a* arranged on a fourth column 4m. The (1-1)st nozzle 4110*a*, the (1-2)nd nozzle 4120*a*, the (1-3)rd nozzle 4130*a*, and the (1-4)th nozzle 4140*a* may constitute one nozzle group, and multiple the nozzle groups may be provided. The nozzle groups may be spaced apart from each other in the x-axis direction of FIG. 8. Other nozzle groups may be spaced apart from each other in the y-axis direction of FIG. 8. The (1-1)st nozzle 4110*a* of each nozzle group apart from each other in the y-axis direction of FIG. 10 may be arranged in an oblique line instead of being arranged in a straight line in the y-axis direction. The (1-2)nd nozzle 4120*a*, the (1-3)rd nozzle 4130*a*, and the (1-4)th nozzle 4140*a* may of each nozzle group may be arranged similarly to the (1-1)st nozzle 4110*a*. For example, each nozzle may be arranged in a line in the x-axis direction and arranged in a line in a direction between the x-axis and the y-axis instead of being arranged in a line in the y-axis direction.

The (1-1)st nozzle 4110*a*, the (1-2)nd nozzle 4120*a*, the (1-3)rd nozzle 4130*a*, and the (1-4)th nozzle 4140*a* of each nozzle group may supply the liquid droplets to different regions of the display substrate S. In other embodiments, at least two of the (1-1)st nozzle 4110*a*, the (1-2)nd nozzle 4120*a*, the (1-3)rd nozzle 4130*a*, and the (1-4)th nozzle 4140*a* of each nozzle group may supply the liquid droplets to the same region of the display substrate S. In other embodiments, at least one of the (1-1)st nozzle 4110*a*, the (1-2)nd nozzle 4120*a*, the (1-3)rd nozzle 4130*a*, and the (1-4)th nozzle 4140*a* of the first nozzle group and at least one of the (1-1)st nozzle 4110*a*, the (1-2)nd nozzle 4120*a*, the (1-3)rd nozzle 4130*a*, and the (1-4)th nozzle 4140*a* of the second nozzle group, which is different from the first nozzle group, may supply the liquid droplets to the same region of the display substrate S. Hereinafter, at least two of the (1-1)st nozzle 4110*a*, the (1-2)nd nozzle 4120*a*, the (1-3)rd nozzle 4130*a*, and the (1-4)th nozzle 4140*a* of a nozzle group are described as supplying liquid droplets to a single region of the display substrate S corresponding to a pixel area.

The concentration of the liquid droplets discharged from the first nozzle 4100*a* arranged in the above may be that shown in FIG. 10. As an example, the X-axis of FIG. 10 denotes a number of the first nozzle 4100*a* arranged on each column. As an example, No. 1 in FIG. 9 may denote the (1-1)st nozzle 4110*a*, the (1-2)nd nozzle 4120*a*, the (1-3)rd nozzle 4130*a*, and the (1-4)th nozzle 4140*a* of a nozzle group arranged on the leftmost portion of FIG. 8. The number that increases toward the right in FIG. 9 may denote a nozzle group positioned on the right of FIG. 8.

The measured concentrations of the liquid droplets respectively discharged from the (1-1)st nozzle 4110*a*, the (1-2)nd nozzle 4120*a*, the (1-3)rd nozzle 4130*a*, and the (1-4)th nozzle 4140*a* may be different from each other. As an example, in FIG. 9, the concentration of particles included in the liquid droplets discharged from the (1-1)st nozzle 4110*a* and the concentration of particles included in the liquid droplets discharged from the (1-4)th nozzle 4140*a* may be greater than the concentration of particles included in the liquid droplets discharged from the (1-2)nd nozzle 4120*a* and the concentration of particles included in the liquid droplets discharged from the (1-3)rd nozzle 4130*a*. The concentration of particles included in the liquid droplets discharged from the (1-1)st nozzle 4110*a* may be similar to the concentration of particles included in the liquid droplets discharged from the (1-4)th nozzle 4140*a*. The concentration of particles included in the liquid droplets discharged from the (1-2)nd nozzle 4120*a* may be similar to the concentration of particles included in the liquid droplets discharged from the (1-3)rd nozzle 4130*a*.

A total concentration of particles arranged on each emission area may be different depending on a nozzle supplying the liquid droplets to each of the emission areas emitting light of the same color. A total concentration of particles arranged on each emission area emitting light of the same color may change depending on a moving distance of the first discharge part 4000*a*, the second discharge part 4000*b*, and the third discharge part 4000*c*. For example, in the case where the first discharge part 4000*a*, the second discharge part 4000*b*, and the third discharge part 4000*c* move by the same distance, each of the (1-1)st nozzle 4110*a*, the (1-2)nd nozzle 4120*a*, the (1-3)rd nozzle 4130*a*, and the (1-4)th nozzle 4140*a* arranged on the (1-1)st head part 4000*a*-1M, a (1-2)nd head part 4000*a*-2M, a (1-3)rd head part 4000*a*-3M, (1-4)th head part 4000*a*-4M, and (1-5)th head part 4000*a*-5M emits light of the same color with repeated repetition period and distances between emission areas adjacent to each other are different. Accordingly, nozzles supplying the liquid droplets to the emission areas adjacent to each other and emitting light of the same color may become different from each other. For example, in case that nozzles of each of the (1-1)st head part 4000*a*-1M, the (1-2)nd head part 4000*a*-2M, the (1-3)rd head part 4000*a*-3M, the (1-4)th head part 4000*a*-4M, and the (1-5)th head part 4000*a*-5M are projected and arranged in a straight line (e.g., a line parallel to the x-axis of FIG. 8), nozzles of the (1-2)nd head part 4000*a*-2M, the (1-3)rd head part 4000*a*-3M, the (1-4)th head part 4000*a*-4M, and the (1-5)th head part 4000*a*-5M may be arranged between nozzles of the (1-1)st head part 4000*a*-1M adjacent to each other. As an example, between the (1-1)st nozzle 4110*a* and the (1-3)rd nozzle 4130*a* of the (1-1)st head part 4000*a*-1M that are adjacent to each other, the (1-1)st nozzle of the (1-2)nd head part 4000*a*-2M, the (1-1)st nozzle of the (1-3)rd head part 4000*a*-3M, the (1-1)st nozzle of the (1-4)th head part 4000*a*-4M, and the (1-1)st nozzle of the (1-5)th head part 4000*a*-5M may be arranged. Among nozzles of each of the (1-1)st head part 4000a-1M, the (1-2)nd head part 4000a-2M, the (1-3)rd head part 4000a-3M, the (1-4)th head part 4000a-4M, and the (1-5)th head part 4000a-5M arranged in a straight line, from the (1-1)st nozzle 4110a of the (1-1)st head part 4000a-1M to the (1-4)th nozzle of the (1-5)th head part 4000a-5M may be arranged in a line, and from the (1-1)st nozzle 4110a of the (1-1)st head part 4000a-1M to the (1-4)th nozzle of the (1-5)th head part 4000a-5M may be repeated. A period by which nozzles projected to an arbitrary straight line are repeated may be defined as the repetition period.

A total concentration of particles included in the liquid droplets supplied to each emission area emitting light of the same color may become different from each other in each emission area. To prevent this issue from occurring, a total concentration of particles included in the liquid droplets supplied to the emission areas emitting light of the same color may become as uniform as possible by making moving distances of the first discharge part 4000a, the second discharge part 4000b, and the third discharge part 4000c different from each other.

FIGS. 11A to 11E are schematic plan views of a portion of a manufacturing apparatus for a display apparatus according to an embodiment. FIGS. 12A and 12B are schematic plan views showing relationship between a nozzle and an emission area according to an embodiment.

Referring to FIGS. 11A to 11E, in case that the manufacturing apparatus for a display apparatus operates, the display substrate S may move in the first direction, and each head part may supply liquid droplets to the display substrate S. Hereinafter, the liquid droplets being supplied to the display substrate S by the first discharge part 4000a is described in detail.

In case that the first discharge part 4000a supplies liquid droplets to the display substrate S as described above, at least a portion of the first discharge part 4000a may be moved in the first direction by a first distance L1 to correspond to at least a portion of the display substrate S, and the display substrate S may be moved in the first direction. Liquid droplets discharged from at least a portion of the first discharge part 4000a may be arranged in a first region S1 of the display substrate S corresponding to each emission area EA.

Figure 11B:
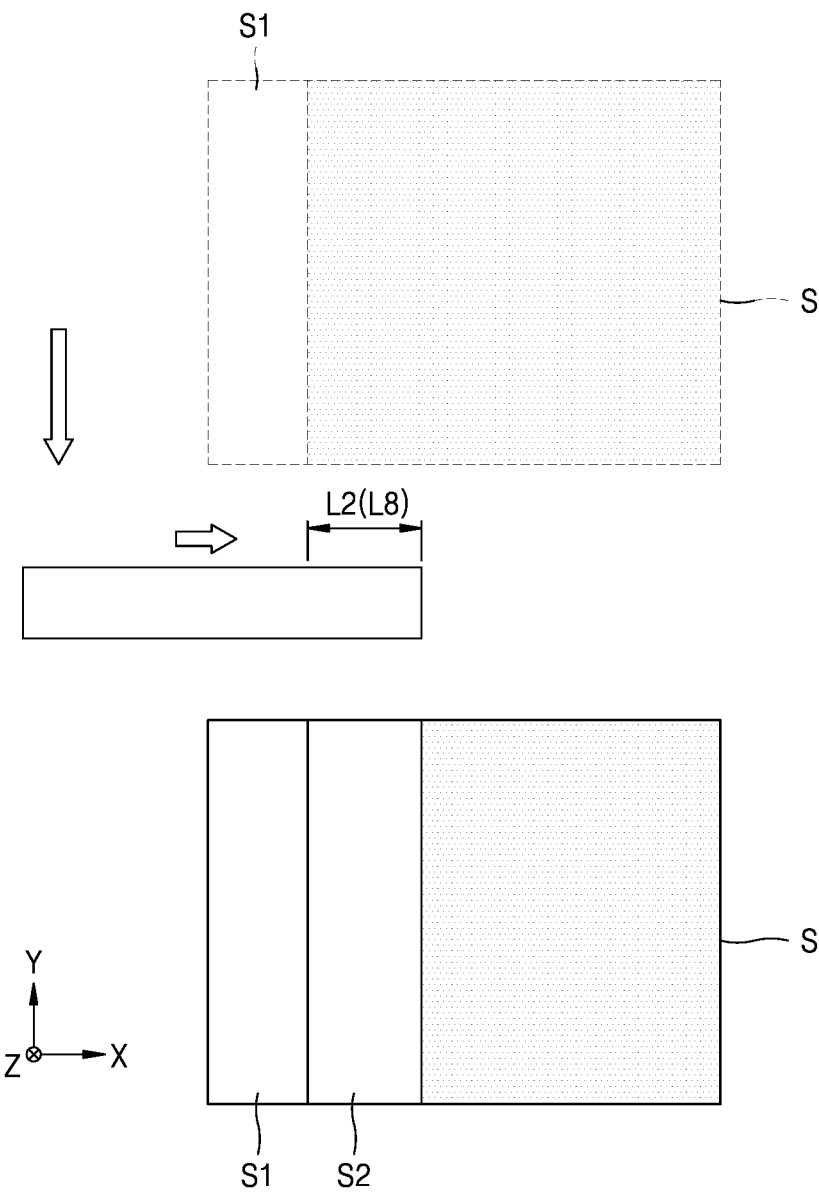
Figure 12A:
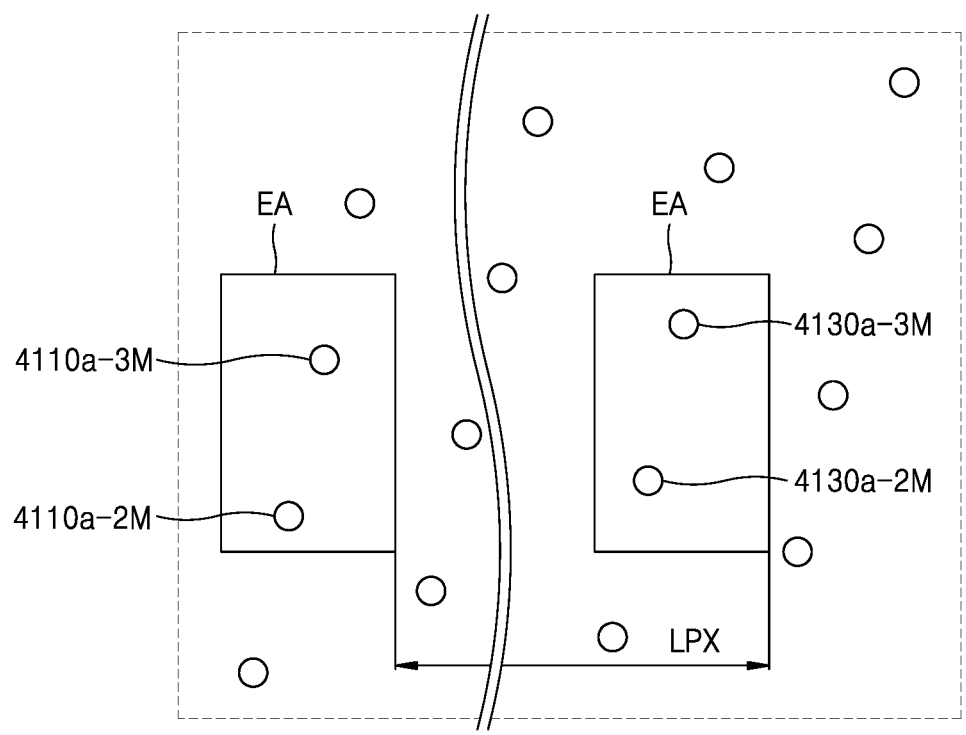
FIGS. 12A and 12B are schematic plan views showing relationship between a nozzle and an emission area according to an embodiment.
Figure 12B:
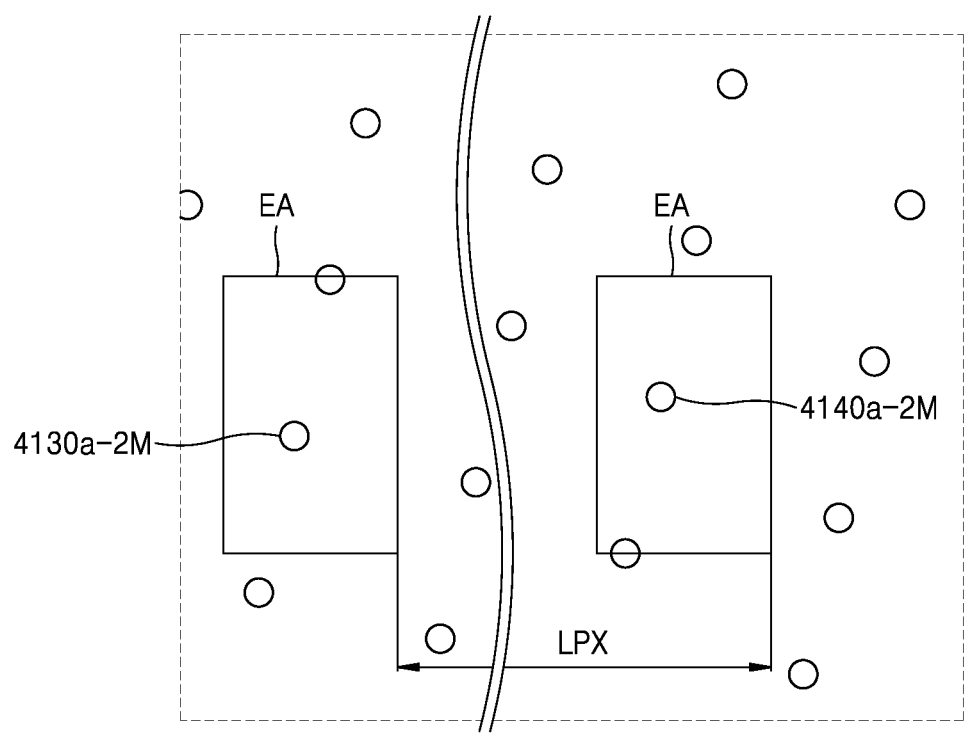

When the above process is completed, as shown in FIG. 11B, the first discharge part 4000a may be moved in the second direction by a second distance L2. While the display substrate S is moved in a direction opposite to the first direction, liquid droplets may be supplied to a second region S2 of the display substrate S. The first discharge part 4000a may supply liquid droplets to the first region S1 as well as the second region S2. In other embodiments, the first discharge part 4000a may supply liquid droplets to only the second area S2 and not supply liquid droplets to the first region S1. Hereinafter, the first discharge part 4000a is supplying liquid droplets to both the first region S1 and the second region S2 is described in detail.

Figure 11C:
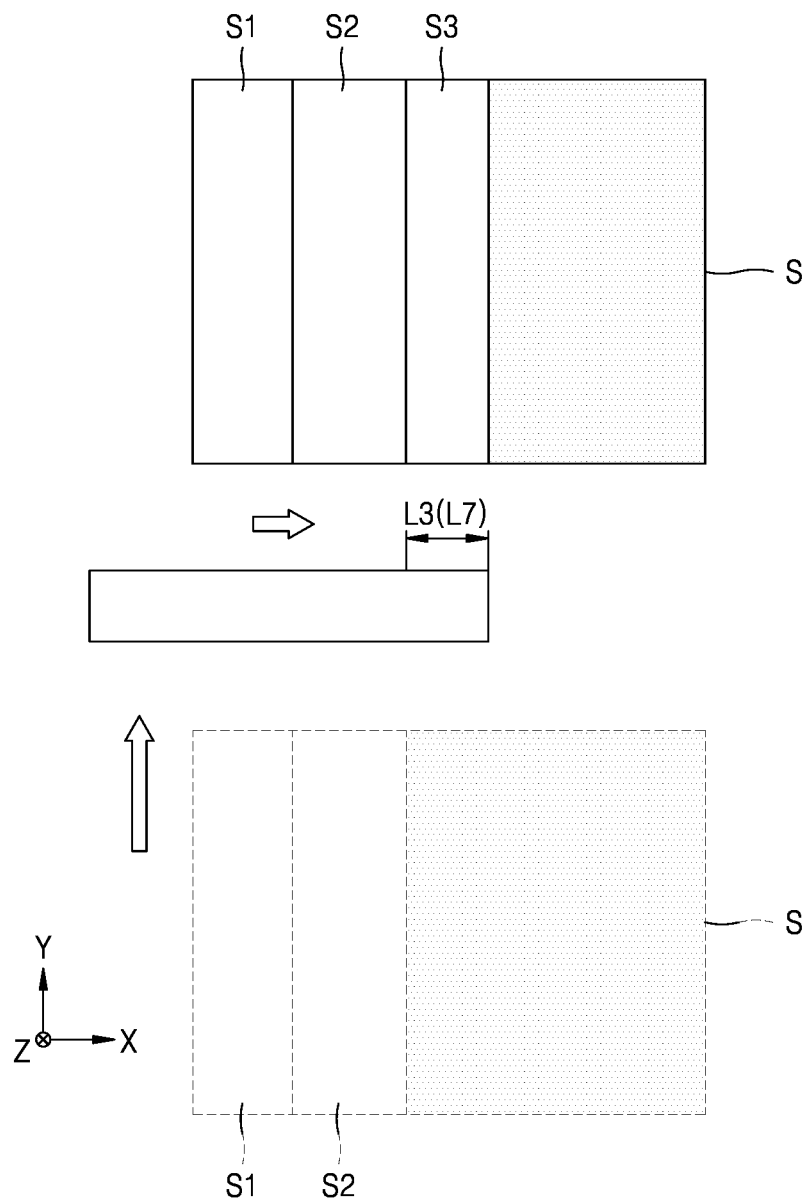

When the above process is completed, as shown in FIG. 11C, the first discharge part 4000a may be moved in the second direction by a third distance L3. While the display substrate S is moved in the first direction, the first discharge part 4000a may supply liquid droplets to the first region S1, the second region S2, and the third region S3.

When the above process is completed, as shown in FIG. 11D, the first discharge part 4000a may be moved in the second direction by a fourth distance L4. Then, while the display substrate S is moved in a direction opposite to the first direction, the first discharge part 4000a may supply liquid droplets to the first region S1, the second region S2, the third region S3, and a fourth region S4.

When the above process is completed, as shown in FIG. 11E, the first discharge part 4000a may be moved in the second direction by a fifth distance L5. Then, while the display substrate S is moved in the first direction, the first discharge part 4000a may be supply liquid droplets to the first region S1, the second region S2, the third region S3, the fourth region S4, and a fifth region S5.

The above operation may be performed while liquid droplets are supplied up to the fifth region S5 and then supplied from the fifth region S5 to the first region S1 again. In this case, the first discharge part 4000a may be configured to supply liquid droplets to the display substrate S while sequentially moving in a direction opposite to the second direction by a sixth distance L6, a seventh distance L7, an eighth distance L8, and a ninth distance L9. The order in which the first discharge part 4000a moves may be the order of FIG. 11E, FIG. 11D, FIG. 11C, FIG. 11B, and FIG. 11A. The sixth distance L6, the seventh distance L7, the eighth distance L8, and the ninth distance L9 may be respectively different from the fourth distance L4, the third distance L3, the second distance L2, and the first distance L1.

The controller 6000 may control one of the first to ninth distances L1, L2, L3, L4, L5, L6, L7, L8, and L9 to be different from another of the first to ninth distances L1, L2, L3, L4, L5, L6, L7, L8, and L9. The controller 6000 may control the first to ninth distances L1, L2, L3, L4, L5, L6, L7, L8, and L9 to be different from one another. The controller 6000 may set each distance to a multiple of a distance LPX between the emission areas EA adjacent to each other and emitting light of the same color. The controller 6000 may determine each distance by using a genetic algorithm based on nozzle information, the emission area information, and information of liquid droplets falling from each nozzle.

When all of the first to ninth distances L1, L2, L3, L4, L5, L6, L7, L8, and L9 are the same, nozzles configured to supply liquid droplets to the emission areas EA emitting light of the same color may be different from each other. As an example, as shown in FIG. 12A, nozzles arranged to correspond to the emission area EA on the left among the emission areas EA emitting light of the same color may be a (1-1)st nozzle 4110a-2M of the (1-2)nd head part and a (1-1)st nozzle 4110a-3M of the (1-3)rd head part. In contrast, nozzles arranged to correspond to the emission area EA on the right may be a (1-3)rd nozzle 4130a-2M of the (1-2)nd head part and a (1-3)rd nozzle 4130a-3M of the (1-3) head part. Due to a concentration difference between the (1-1)st nozzle 4110a-2M of the (1-2)nd head part and the (1-1)st nozzle 4110a-3M of the (1-3)rd head part, and the (1-3)rd nozzle 4130a-2M of the (1-2)nd head part and the (1-3)rd nozzle 4130a-3M of the (1-3) head part, a concentration difference of particles may occur in the emission area EA emitting light of the same color. Furthermore, in the case where all of the first to ninth distances L1, L2, L3, L4, L5, L6, L7, L8, and L9 are the same, even when the first discharge part 4000a is moved repeatedly, because each first nozzle 4100a is always arranged on the same position, it may be difficult to make the concentration of particles included in each emission area EA emitting light of the same color uniform or similar to each other.

In contrast, in the case where one of the first to ninth distances L1, L2, L3, L4, L5, L6, L7, L8, and L9 is different from another of the first to ninth distances L1, L2, L3, L4, L5, L6, L7, L8, and L9, because it is possible to change the first nozzle 4100a arranged to correspond to each emission area EA emitting light of the same color, the above issue may be resolved. Where all of the first to ninth distances L1, L2, L3, L4, L5, L6, L7, L8, and L9 are changed, because it is possible to variously change the first nozzle 4100a arranged to correspond to each emission area EA emitting light of the same color, the concentration of liquid droplets supplied to each emission area EA may be diversified. The concentrations of particles included in each emission area EA may be uniform or similar to each other. Where the first to ninth distances L1, L2, L3, L4, L5, L6, L7, L8, and L9 are different, nozzles arranged again in each emission area EA shown in FIG. 12A may be different from each other. As an example, a nozzle arranged to correspond to the emission area EA on the left of FIG. 12B may be a (1-3)rd nozzle 4130-2M of the (1-2)nd head part. A nozzle arranged to correspond to the emission area EA on the right of FIG. 12B may be a (1-4)th nozzle 4140a-2M of the (1-2)nd head part. Because nozzles corresponding to each emission area EA shown in FIG. 12A become different, the concentrations of particles included in all the liquid droplets supplied to each emission area EA may become uniform over the emission areas EA.

Liquid droplets may be supplied to the entire region of the display substrate S over multiple passes. The first discharge part 4000a may pass over the upper surface of the same region of the display substrate S by at least twice. As described above, because moving distances of the first discharge part 4000a become different from each other, regions of the first discharge part 4000a arranged in each region of the display substrate S may become different in each scan. Because regions of the first discharge part 4000a arranged in the same region of the display substrate S become different from each other during different scan processes, first nozzles 4100a arranged to correspond to the same emission area EA may become different. As an example, in the case where only (1-1)st nozzles 4110a of the first head parts are arranged to correspond to one emission area EA during a first scan (e.g., one of the manufacturing orders shown in FIGS. 11A to 11E), at least one of (1-2)nd nozzles 4120a and (1-3)rd nozzles 4130a of the first head parts may be arranged to the same emission area EA to correspond to the same emission area EA during another scan (e.g., another of the manufacturing orders shown in FIGS. 11A to 11E). Through this, the concentration of particles arranged in the emission area EA emitting light of the same color may become uniform.

Where the discharge part moves as shown in FIGS. 11A to 11E, at least one of the (1-1)st nozzle 4110a and the (1-4)th nozzle 4140a of the same or similar number may be arranged to the display substrate corresponding to each emission area. For example, in the case where the discharge part moves by the same distance, there may be emission areas emitting light of the same color in which at least one of the (1-1)st nozzle 4110a and the (1-4)th nozzle 4140a is arranged, and there may be emission areas in which the (1-1)st nozzle 4110a and the (1-4)th nozzle 4140a are not arranged. While the first discharge part 4000a moves as shown in FIGS. 11A to 11E, the moving distances of the first discharge part 4000a become different from each other, at least one of the (1-1)st nozzle 4110a and the (1-4)th nozzle 4140a may be arranged in the emission area in which the (1-1)st nozzle 4110a and the (1-4)th nozzle 4140a have not been arranged while the first discharge part moves by the same distance. The multiple emission areas emitting light of the same color may have concentrations of particles similar to each other.

Accordingly, because moving distances of the discharge part become different from each other as described above, the particles in each emission area EA may become uniform distributed, and thus, a moiré phenomenon due to the concentration of particles may be reduced.

Hereinafter, a method of calculating the first to ninth distances L1, L2, L3, L4, L5, L6, L7, L8, and L9 is described in detail.

Figure 14:
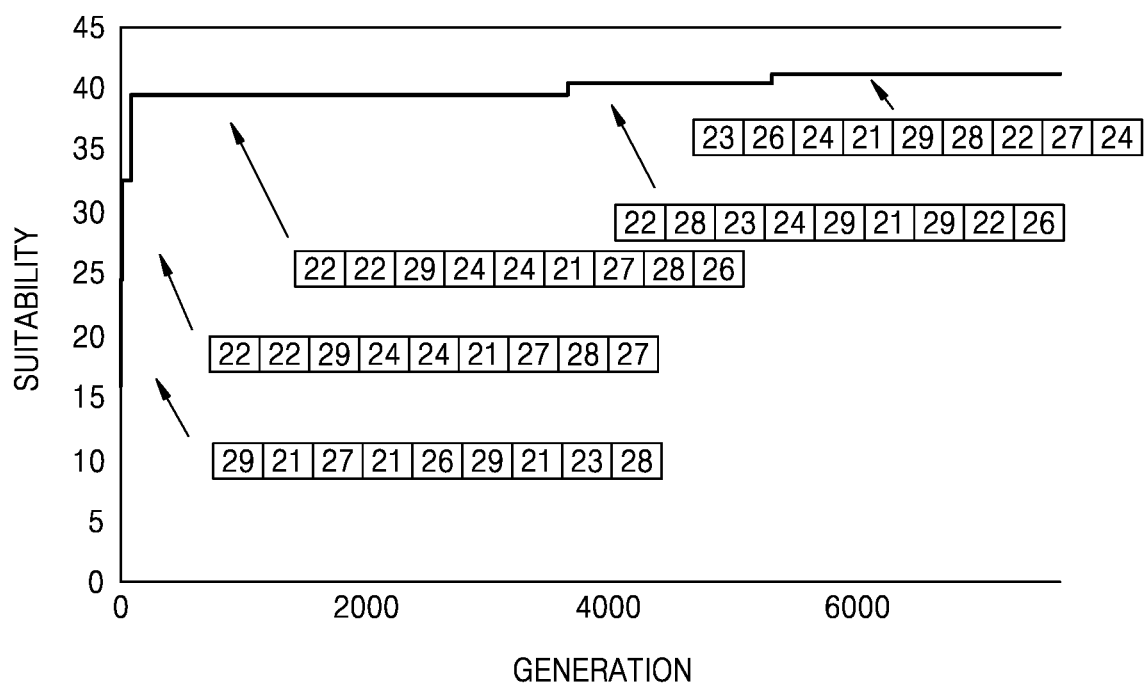
FIG. 14 is a graph showing the suitability for each generation based on a method of manufacturing a display apparatus according to an embodiment.
Figure 15A:
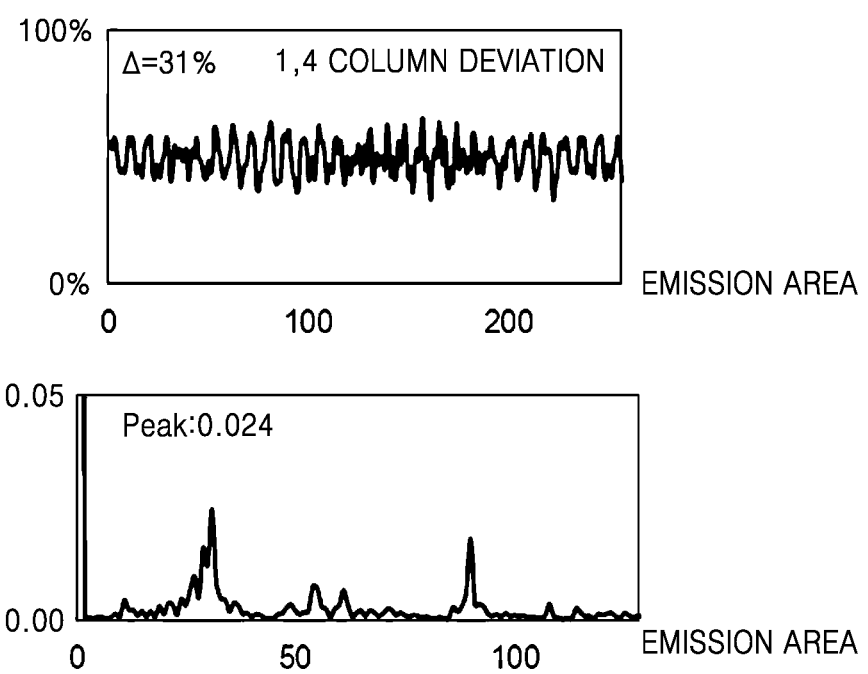
FIGS. 15A to 15E are graphs according to pixel position for each generation and concentration of scatterers based on a method of manufacturing a display apparatus and graphs according to pixel position and a deviation of nozzles according to an embodiment.
Figure 15B:
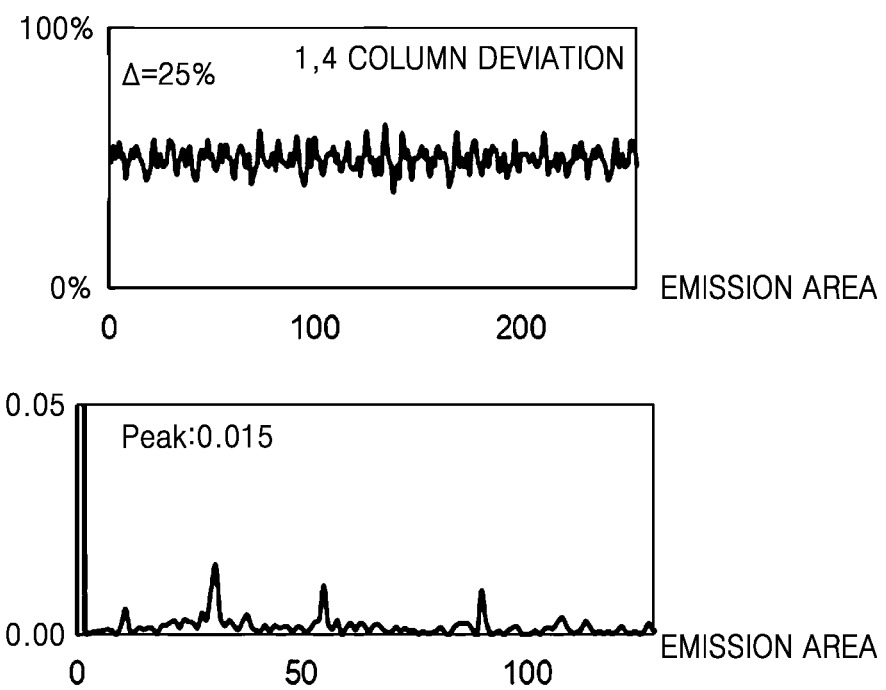
Figure 15C:
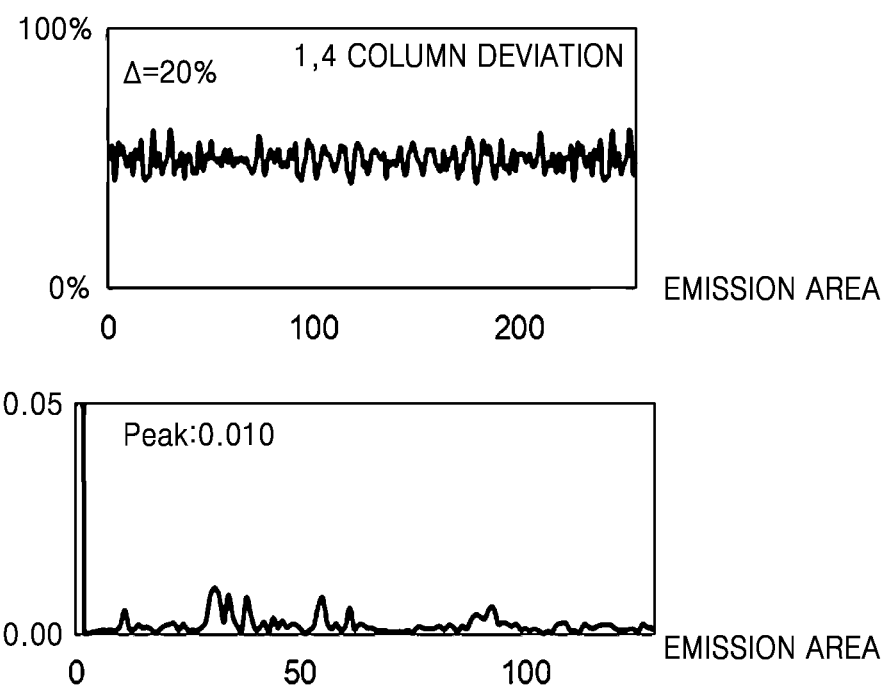
Figure 15D:
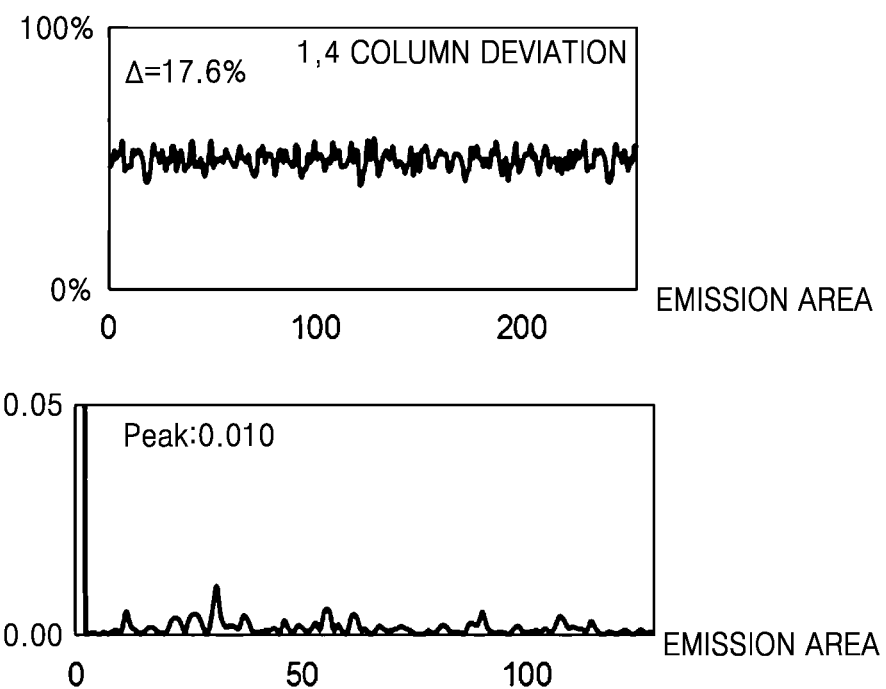
Figure 15E:
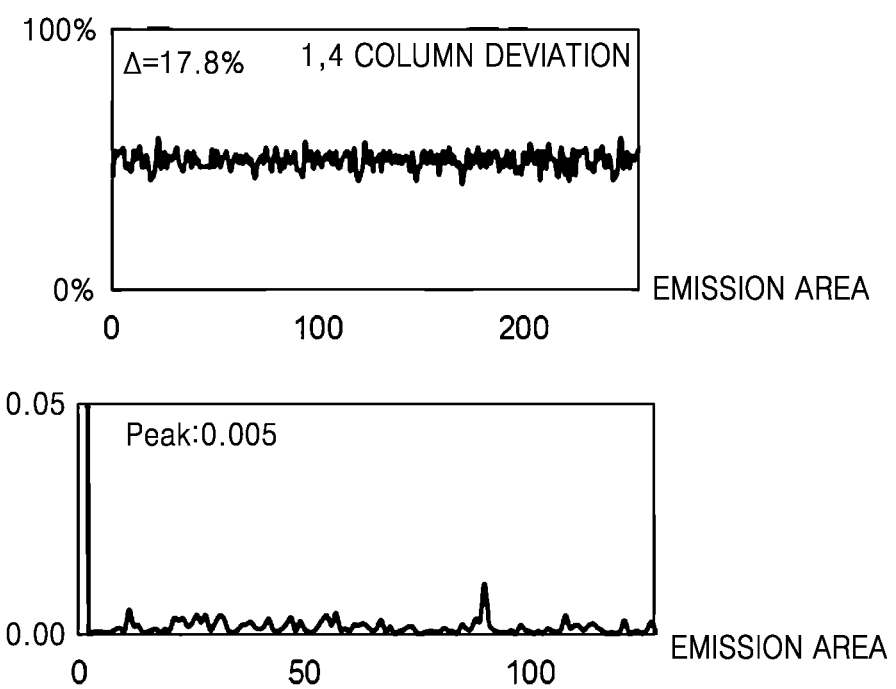

FIG. 13 is a flowchart showing a method of manufacturing a display apparatus according to an embodiment. FIG. 14 is a graph showing suitability for each generation based on a method of manufacturing a display apparatus according to an embodiment. FIGS. 15A to 15E are graphs according to pixel position for each generation and concentration of scatterers based on a method of manufacturing a display apparatus and graphs according to pixel position and a deviation of nozzles according to an embodiment.

Referring to FIG. 13, as described above, information of nozzles (e.g., the configuration of nozzles, the number of nozzles, the number of head parts, and the like), information of emission areas (e.g., a distance between emission areas, the number of emission areas, the size of a substrate, and the like), and the concentration of each nozzle may be input. The above information may determine how many times the discharge part needs to be moved, what is the moving distance of the discharge part, how many times the substrate needs to be linearly moved, and the like.

After the above information is input, how many times the discharge part needs to be moved may be checked. As an example, the number of times to move the discharge part and the number of times to linearly move the substrate may be set to 9 times, respectively, and the moving distance of the discharge part may be set to a distance between twenty five emission areas.

After the information is determined as described above, chromosome may be determined. A chromosome may be set as a combination of numbers excluding a distance when the discharge part moves by a preset distance from the number of times the discharge part moves. As an example, when the discharge part moves 9 times and the discharge part moves constantly, the discharge part moves by a distance between 25 emission areas, a moving distance when the discharge part moves once may be a combination of remaining 9 numbers excluding a distance between 25 emission areas. To prevent the discharge part from moving excessively out of range, a distance by which the discharge part moves at one time may be set as a distance between the 25 emission areas minus or plus a distance between three emission areas. A combination of 9 numbers may be set arbitrarily. The number of combinations of 9 numbers may be set arbitrarily.

When the above process is completed, suitability of each chromosome may be calculated. The suitability may be calculated as the concentration of particles arranged in each pixel area while the discharge part moves. As an example, the suitability may be determined by Equation 1 below.

$$\text{suitability} = \frac{1}{1.4 \text{ Column Deviation}^2} + 10(1 - |Ref. \text{ movement} - Avg. \text{ movement}|) \qquad \text{Equation 1}$$

In this case, the 1,4 column ratio deviation (or column deviation) may denote a probability that at least one of a (1-1)st nozzle and a (1-4)th nozzle is arranged in each pixel area. The reference movement may denote a moving distance when the discharge part moves the same distance. The average movement may denote an average of moving distances when the discharge part moves different distances.

Depending on suitability, several genes close to the solution may be selected through a roulette wheel selection method, a tournament method, a rank-based selection method, and the like. Hereinafter, a combination close to the solution is described as being elected through a rank-based selection method.

A combination of distances of high suitability may be determined as being close to the solution based on the suitability, and selected as suitable genes. Mutation may be performed in which the numerical sequence of at least one gene among selected genes is changed or a number is replaced by a completely different number. Genes having a new numerical combination may be generated by exchanging (crossover) a number included in one gene with a number included in another gene.

Whether the generated genes have a higher suitability than a maximum suitability set in advance may be determined by calculating Equation 1. When the calculated suitability exceeds the maximum suitability, the procedure is ended, and nine numbers of the combination may be sequentially set to the first to ninth distances L1, L2, L3, L4, L5, L6, L7, L8, and L9, respectively. In contrast, when the calculated suitability is equal to or less than the maximum suitability, some genes having a combination of distances of high suitability is selected from among all genes based on the suitability again, and the above process may be repeated for some of the genes.

Examination of the results calculated by the above process shows that, in the case where the maximum suitability is 40, a solution having suitability exceeding 40 may be calculated after about 6000 generations as shown in FIG. 14.

Referring to FIGS. 15A to 15E, in the above calculation process, a probability that a (1-1)st nozzle and a (1-4)th nozzle corresponding to each emission area are arranged based on a combination of a highest suitability among combinations of numbers of each gene may have a reduced deviation in each emission area. For example, a deviation between the probabilities is gradually reduced to about 31% initially in each pixel area, about 25% after 9 generations, about 20% after 93 generations, about 17.6% after 3631 generations, and about 17.8% after 5288 generations, and thus, a probability that a (1-1)st nozzle or a (1-4)th nozzle is arranged once in a portion corresponding to each pixel area may increase. Examination of the concentration of particles arranged in each pixel area based on the above results shows that a peak value is about 0.024 wt % in some pixel area in a first generation, a peak value is about 0.015 wt % in some pixel area in a ninth generation, a peak value is about 0.010 wt % in some pixel area in a 93rd generation, and a peak value is about 0.005 wt % in some pixel area after a 5288 generation. Accordingly, not only an absolute value of a peak value may be gradually reduced but also the concentration of particles arranged in each pixel area may become uniform.

Accordingly, in the manufacturing apparatus for a display apparatus and the method of manufacturing a display apparatus, while liquid droplets are supplied to the display substrate, because moving distances of discharge parts are adjusted differently, the concentration of particles distributed in the emission areas may become uniform, the emissions areas being distributed on the entire surface of the display substrate, being spaced apart from each other, and emitting light of the same color. In the manufacturing apparatus for a display apparatus and the method of manufacturing a display apparatus, because the concentration of particles distributed in each emission area becomes uniform, moiré phenomena due to a concentration difference of particles may be reduced.

The method of manufacturing a display apparatus according to an embodiment may reduce moiré phenomena that may occur after a material is coated.

The method of manufacturing a display apparatus according to an embodiment may manufacture a precise display apparatus.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
   moving a discharge part from an edge portion of a substrate by a first distance along a side of the substrate and discharging liquid droplets in a first area of the substrate adjacent to the edge portion of the substrate;
   moving the discharge part from the first area of the substrate by a second distance along the side of the substrate and discharging the liquid droplets in the first area and a second area of the substrate;
   moving the discharge part from the second area of the substrate by a third distance along the side of the substrate and discharging the liquid droplets in the first area, the second area, and a third area of the substrate,
   wherein the first distance is shorter than the second distance and longer than the third distance.

2. The method of claim 1, wherein the liquid droplets include quantum dots.

3. The method of claim 2, wherein the liquid droplets include scatterers.

4. The method of claim 2, wherein the liquid droplets include titanium oxide.

5. The method of claim 1, further comprising:
   forming a color filter layer over the substrate.

6. The method of claim 1, wherein the first distance and the second distance each are a multiple of a distance between emission areas emitting light of a same color.

7. The method of claim 1, further comprising:
   arranging nozzles to correspond to different emission areas that emit light of a same color,
   wherein the nozzles are different from each other.

8. The method of claim 1, further comprising:
   linearly moving the substrate in a first direction.

9. The method of claim 8, further comprising:
   linearly moving the substrate in a direction opposite to the first direction.

10. The method of claim 8, wherein the discharge part moves in a direction different from the first direction.

11. A method of manufacturing a display apparatus, the method comprising:
    moving a discharge part from an edge portion of a substrate by a first distance along a side of the substrate;
    discharging liquid droplets in a first area of the substrate adjacent to the edge portion of the substrate while linearly moving the substrate in a first direction;

moving the discharge part from the first area of the substrate by a second distance along the side of the substrate;

discharging the liquid droplets in the first area and a second area of the substrate from the discharge part while linearly moving the substrate in a direction opposite to the first direction;

moving the discharge part from the second area of the substrate by a third distance along the side of the substrate; and discharging the liquid droplets in the first area, the second area, and a third area of the substrate from the discharge part while linearly moving the substrate in the first direction, wherein the first distance is shorter than the second distance and longer than the third distance.

12. The method of claim 11, wherein the liquid droplets include quantum dots.

13. The method of claim 12, wherein the liquid droplets include scatterers.

14. The method of claim 13, wherein the liquid droplets include titanium oxide.

15. The method of claim 11, wherein the first distance and the second distance each are a multiple of a distance between emission areas emitting light of a same color.

16. The method of claim 11, further comprising:
forming a color filter layer over the substrate.

17. The method of claim 11, wherein a moving direction of the discharge part is different from the first direction.

18. The method of claim 11, further comprising:
forming a thin-film encapsulation layer over the substrate.

19. The method of claim 11, further comprising:
arranging the substrate on a display panel.

20. The method of claim 11, wherein the discharge part includes a plurality of nozzles.

* * * * *